United States Patent [19]
Takahashi

[11] Patent Number: 5,948,573
[45] Date of Patent: Sep. 7, 1999

[54] METHOD OF DESIGNING MASK PATTERN TO BE FORMED IN MASK AND METHOD OF MANUFACTURING INTEGRATED CIRCUIT

[75] Inventor: Hiroshi Takahashi, Kanagawa, Japan

[73] Assignee: Sony Corporation, Tokyo, Japan

[21] Appl. No.: 09/026,236

[22] Filed: Feb. 19, 1998

[30] Foreign Application Priority Data

Feb. 21, 1997 [JP] Japan ................................. 9-037898
Jun. 5, 1997 [JP] Japan ................................. 9-147532

[51] Int. Cl.⁶ .................................................. G03F 9/00
[52] U.S. Cl. ........................................................ 430/5
[58] Field of Search .............................. 430/5, 22, 311, 430/322, 394

[56] References Cited

U.S. PATENT DOCUMENTS 5,792,581 7/1998 Hidetoshi ..................................... 430/5

*Primary Examiner*—S. Rosasco
*Attorney, Agent, or Firm*—Hill & Simpson

[57] ABSTRACT

A method of designing a mask pattern to be formed in a mask used for manufacturing an integrated circuit by forming a pattern in a first layer deposited on a substrate, on the basis of lithography to which said mask is applied, then depositing a second layer on the substrate including the patterned first layer and flattening the second layer by a chemical/mechanical polishing process, the method comprising the steps of (A) dividing the mask pattern into meshes having the form of a lattice and having a predetermined size, and determining pattern area ratios $\alpha_0(i,j)$ of the meshes(i,j), respectively, (B) determining an average pattern area ratio $\beta(i,j)$ within a predetermined region including a mesh(i,j) as the central point in the predetermined region with regard to each of all the meshes in the mask pattern, and (C) providing a dummy pattern to each of the meshes(i,j) which have been found in the step (B) to have the average pattern area ratios $\beta(i,j)$ smaller than a predetermined value.

74 Claims, 19 Drawing Sheets

(PRIOR ART) CONTINUED

METHOD OF DESIGNING MASK PATTERN TO BE FORMED IN MASK AND METHOD OF MANUFACTURING INTEGRATED CIRCUIT

BACKGROUND OF THE INVENTION AND RELATED ART

The present invention relates to a method of designing a mask pattern to be formed in a mask for use with a lithography process and a method of manufacturing an integrated circuit through the mask produced on the basis of said method of designing a mask pattern.

Generally, an integrated circuit is designed according to a method of combining partial circuits having a size easy to handle, and each partial circuit is called "circuit block". A pattern constituting an integrated circuit generally belongs to one of circuit blocks. In a conventional method of designing a mask pattern to be formed in a mask used with a lithography process, the circuit blocks which are designed in advance are automatically arranged so as to attain a minimum chip area. In the automatic arrangement of the circuit blocks, there is employed an algorithm in which the distances between the circuit blocks are decreased so as to be smallest possible. Meanwhile, the circuit blocks having a larger number of patterns and the circuit blocks having a smaller number of patterns exist in one chip. When the chip is divided into meshes having the form of a lattice and pattern area ratios $\alpha'$ of the meshes are determined, the pattern area ratios $\alpha'$ greatly vary.

In one of the techniques for coping with an increase in the integration degree of integrated circuits, flattening treatment is carried out when an integrated circuit is produced. A chemical/mechanical polishing process (to be sometimes simply referred to as "CMP" hereinafter) is among techniques for the flattening treatment. FIG. 11 schematically shows a polishing apparatus for use with the above CMP process. The polishing apparatus has a polishing plate, a substrate holder and an abrasive slurry feeding system. The polishing plate is supported with a rotatable polishing plate rotation shaft, and is provided with a polishing pad on its surface. The substrate holder is disposed above the polishing plate and supported with a substrate hold rotation shaft. For example, when a substrate is polished, the substrate is attached to the substrate holder. The substrate holder rotation shaft is attached to a polishing pressure adjusting mechanism (not shown) which thrusts the substrate holder toward the polishing pad. Then, while an abrasive slurry containing an abrasive is fed to the polishing pad from the abrasive slurry feeding system, the polishing plate is turned. At the same time, the substrate attached to the substrate holder is turned, and the pressure between the substrate and the polishing pad is adjusted with the polishing pressure adjusting mechanism. In this manner, the surface of the substrate is polished.

The outline of a conventional CMP process will be explained with reference to FIGS. 17A to 17D below. As shown in the schematic partial cross-sectional view of FIG. 17A, first, a first layer 11 composed of, for example, polysilicon doped with an impurity is deposited on an underlayer 10 composed of, for example, an insulation layer. Then, a pattern is formed in the first layer 11 by lithography and etching (see FIG. 17B). A patterned portion of the first layer is indicated by reference numeral 12. Then, a second layer 14 (for example, an insulation layer) is deposited on the entire surface (see FIG. 17C), and the second layer 14 is flattened by the CMP process. However, when the pattern area ratios $\alpha'$ greatly vary in the patterned first layer 12, the following problem takes place. That is, a portion of the second layer 14 on a portion of the first layer 12 having a lower pattern area ratio $\alpha'$ is much more polished than a portion of the second layer 14 on a portion of the first layer 12 having a higher pattern area ratio $\alpha'$ (see FIG. 17D). This phenomenon is called "dishing". As a result, the flattening treatment of the second layer 14 is made difficult.

One method of overcoming the above problem is disclosed in Extended Abstract of the 1996 International Conference on Solid State Device and Materials, S. Deleonibus, et al., YOKOHAMA, pp. 836–838. As shown in schematic partial cross-sectional views of FIGS. 18A and 18B, it is assumed that an area of the first layer 12 having a high pattern area ratio $\alpha'$ and an area of the first layer 12 having a low pattern area ratio $\alpha'$ are included, and the area of the first layer 12 having a high pattern area ratio $\alpha'$ is schematically shown as a rectangular form. In the above method, a resist 40 is formed on the second layer 14 (see FIG. 18C). The resist 40 is then patterned by lithography such that the second layer 14 on the area of the first layer 12 having a high pattern area ratio $\alpha'$ is not covered with the resist 40 (see FIG. 19A). Then, the patterned resist 40 is used to partially etch the second layer 14 in a thickness direction (see FIG. 19B). Thereafter, the resist 40 is removed, and the CMP process is applied to the remaining layer 14.

In the above manner, the second layer 14 can be flattened regardless of the pattern area ratios $\alpha'$ of the patterned first layer 12. However, the above method has the following problems. The step of patterning the resist 40 and the step of etching the second layer 14 are required, so that the number of steps of the CMP process as a whole increases. Moreover, it is difficult to control the depth when the second layer 14 is partially etched in a depth direction. Further, there is another problem that the manufacturing cost of integrated circuits increases, and the yield thereof decreases.

OBJECT AND SUMMARY OF THE INVENTION

It is therefore an object of the present invention to provide a method of designing a mask pattern to be formed in a mask for use with a lithography process, which method enables the flattening treatment of a second layer or a layer without being affected by the pattern area ratios of patterns formed in a first layer or a substrate and does not require additional treatment steps in a CMP process, and a method of manufacturing an integrated circuit.

The method of designing a mask pattern to be formed in a mask according to a first aspect of the present invention for achieving the above object is directed to a method of designing a mask pattern to be formed in a mask used for manufacturing an integrated circuit by forming a pattern in a first layer deposited on a substrate, on the basis of lithography to which said mask is applied, then depositing a second layer on the substrate including the patterned first layer and flattening the second layer by a chemical/mechanical polishing process.

The method of designing a mask pattern to be formed in a mask according to a second aspect of the present invention for achieving the above object is directed to a method of designing a mask pattern to be formed in a mask used for manufacturing an integrated circuit by forming a pattern in a substrate, on the basis of lithography to which said mask is applied, then depositing a layer on the substrate and flattening the layer by a chemical/mechanical polishing process.

Further, the method of designing a mask pattern to be formed in a mask according to a third aspect of the present invention for achieving the above object is directed to a method of designing a mask pattern to be formed in a mask used for manufacturing an integrated circuit by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process.

The method of designing a mask pattern according to the first, second or third aspect of the present invention comprises the steps of (A) dividing the mask pattern into meshes having the form of a lattice and having a predetermined size, and determining pattern area ratios $\alpha_0(i,j)$ of the meshes(i, j), respectively, (B) determining an average pattern area ratio $\beta(i,j)$ within a predetermined region including a mesh(i,j) as the central point in the predetermined region with regard to each of all the meshes in the mask pattern, and (C) providing a dummy pattern to each of the meshes(i,j) which have been found in the step (B) to have the average pattern area ratios $\beta(i,j)$ smaller than a predetermined value.

The method of designing a mask pattern to be formed in a mask according to a fourth aspect of the present invention for achieving the above object is directed to a method of designing a mask pattern to be formed in a mask used for manufacturing an integrated circuit by forming a pattern in a first layer deposited on a substrate, on the basis of lithography to which said mask is applied, then depositing a second layer on the substrate including the patterned first layer and flattening the second layer by a chemical/mechanical polishing process.

The method of designing a mask pattern to be formed in a mask according to a fifth aspect of the present invention for achieving the above object is directed to a method of designing a mask pattern to be formed in a mask used for manufacturing an integrated circuit by forming a pattern in a substrate, on the basis of lithography to which said mask is applied, then depositing a layer on the substrate and flattening the layer by a chemical/mechanical polishing process.

Further, the method of designing a mask pattern to be formed in a mask according to a sixth aspect of the present invention for achieving the above object is directed to a method of designing a mask pattern to be formed in a mask used for manufacturing an integrated circuit by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process.

The method of designing a mask pattern according to the fourth, fifth or sixth aspect of the present invention comprises the steps of (A) dividing the mask pattern into meshes having the form of a lattice and having a predetermined size, and determining pattern area ratios $\alpha_0(i,j)$ of the meshes(i, j), respectively, (B) determining an average pattern area ratio $\beta(i,j)$ within a predetermined region including a mesh(i,j) as the central point in the predetermined region with regard to each of all the meshes in the mask pattern, and (C) rearranging the pattern in the mask pattern so as to decrease the fluctuation of the average pattern area ratios $\beta(i,j)$.

The method of manufacturing an integrated circuit according to a first aspect of the present invention for achieving the above object is directed to a method of manufacturing an integrated circuit by forming a pattern in a first layer deposited on a substrate, then depositing a second layer on the substrate including the patterned first layer and flattening the second layer by a chemical/mechanical polishing process.

The method of manufacturing an integrated circuit according to a second aspect of the present invention for achieving the above object is directed to a method of manufacturing an integrated circuit by forming a pattern in a substrate, then depositing a layer on the substrate and flattening the layer by a chemical/mechanical polishing process.

Further, the method of manufacturing an integrated circuit according to a third aspect of the present invention for achieving the above object is directed to a method of manufacturing an integrated circuit by forming a pattern in a starting substrate, then bonding the front surface of the starting substrate to a supporting substrate and flattening the starting substrate from the back surface of the starting substrate by a chemical/mechanical polishing process.

In the method of manufacturing an integrated circuit according to the first, second or third aspect of the present invention, a mask pattern to be formed in a mask is designed by the steps of (A) dividing the mask pattern into meshes having the form of a lattice and having a predetermined size, and determining pattern area ratios $\alpha_0(i,j)$ of the meshes(i, j), respectively, (B) determining an average pattern area ratio $\beta(i,j)$ within a predetermined region including a mesh(i,j) as the central point in the predetermined region with regard to each of all the meshes in the mask pattern, and (C) providing a dummy pattern to each of the meshes(i,j) which have been found in the step (B) to have the average pattern area ratios $\beta(i,j)$ smaller than a predetermined value. And, the pattern is formed in the first layer in the method of manufacturing an integrated circuit according to the first aspect of the present invention, in the substrate in the method of manufacturing an integrated circuit according to the second aspect of the present invention, and in the starting substrate in the method of manufacturing an integrated circuit according to the third aspect of the present invention, on the basis of lithography to which said mask is applied.

The method of manufacturing an integrated circuit according to a fourth aspect of the present invention for achieving the above object is directed to a method of manufacturing an integrated circuit by forming a pattern in a first layer deposited on a substrate, then depositing a second layer on the substrate including the patterned first layer and flattening the second layer by a chemical/mechanical polishing process.

The method of manufacturing an integrated circuit according to a fifth aspect of the present invention for achieving the above object is directed to a method of manufacturing an integrated circuit by forming a pattern in a substrate, then depositing a layer on the substrate and flattening the layer by a chemical/mechanical polishing process.

Further, the method of manufacturing an integrated circuit according to a sixth aspect of the present invention for achieving the above object is directed to a method of manufacturing an integrated circuit by forming a pattern in a starting substrate, then bonding the front surface of the starting substrate to a supporting substrate and flattening the starting substrate from the back surface of the starting substrate by a chemical/mechanical polishing process.

In the method of manufacturing an integrated circuit according to the fourth, fifth or sixth aspect of the present invention, a mask pattern to be formed in a mask is designed by the steps of (A) dividing the mask pattern into meshes having the form of a lattice and having a predetermined size, and determining pattern area ratios $\alpha_0(i,j)$ of the meshes(i, j), respectively, (B) determining an average pattern area ratio $\beta(i,j)$ within a predetermined region including a mesh(i,j) as the central point in the predetermined region with regard to each of all the meshes in the mask pattern, and (C) rearranging the pattern in the mask pattern so as to decrease the fluctuation of the average pattern area ratios $\beta(i,j)$. And, the pattern is formed in the first layer in the method of manufacturing an integrated circuit according to the fourth aspect of the present invention, in the substrate in the method of manufacturing an integrated circuit according to the fifth aspect of the present invention, and in the starting substrate in the method of manufacturing an integrated circuit according to the sixth aspect of the present invention, on the basis of lithography to which said mask is applied.

In the method of designing a mask pattern according to any one of the first to sixth aspects of the present invention or the method of manufacturing an integrated circuit according to any one of the first to sixth aspects of the present invention, the average pattern area ratio $\beta(i,j)$ is preferably determined on the basis of the following equations (1-1) and (1-2). In the equation (1-1), the value of Q can be any value of at least 0, while it is preferably about 10. As shown in the equation (1—1), more accurate $\beta(i,j)$ value can be obtained by smoothing (averaging) the value of $\alpha_{q+1}(i,j)$.

$$\alpha_{q+1}(i,j) = \sum_{l=-m}^{l=m} \sum_{k=-m}^{k=m} \alpha_q(i+l, j+k)/(2m+1)^2 \quad (1\text{-}1)$$

$$\beta(i,j) = \alpha_{Q+1}(i,j) \quad (1\text{-}2)$$

wherein q=0, 1, 2, . . . . , Q.

In the method of designing a mask pattern according to the first aspect of the present invention, or in the method of manufacturing an integrated circuit according to the first aspect of the present invention, when an underlayer exists under the first layer and a pattern is formed in the underlayer, a value of a pattern area ratio $\alpha_u(i,j)$ or a value of an average pattern area ratio $\beta_u(i,j)$ of a mask pattern in a mask used for forming the pattern in the underlayer provided under the first layer is preferably incorporated for determining the pattern area ratio $\alpha_0(i,j)$ of each mesh(i,j). In this case, the pattern area ratio $\alpha_0(i,j)$ of each mesh(i,j) is preferably determined on the basis of the following equation (2) when the underlayer is not chemical/mechanical-polished, and the pattern area ratio $\alpha_0(i,j)$ of each mesh(i,j) is preferably determined on the basis of the following equation (3) when the underlayer is chemical/mechanical-polished, $$\alpha_0(i,j)=\alpha_s(i,j)+(h_u/h_s)\cdot\alpha_u(i,j) \quad (2)$$

$$\alpha_0(i,j)=\alpha_s(i,j)+(h_u/h_s)\cdot\beta_u(i,j) \quad (3)$$

wherein $\alpha_s(i,j)$ is a pattern area ratio of the mesh(i,j) when it is assumed that no underlayer exists under the first layer, $h_s$ is a difference in level arising in the first layer after the formation of the pattern and $h_u$ is a difference in level arising in the underlayer.

In the method of designing a mask pattern according to the fourth, fifth or sixth aspect of the present invention, or in the method of manufacturing an integrated circuit according to the fourth, fifth or sixth aspect of the present invention, the pattern in the mask pattern belongs to one of a plurality of circuit blocks, except for the pattern connecting one circuit block to another circuit block. The pattern rearrangement in the above step (C) preferably includes the increase of size of the circuit block (increase of the circuit block in external dimensions). When the size of a circuit block including a large average pattern area ratio $\beta(i,j)$ is increased for increasing the size of the circuit block, a pattern in the circuit block is retained intact, and no pattern is provided in a region which increases the size of the circuit block. Alternatively, the pattern is rearranged in a region which increases the size of the circuit block. When the size of a circuit block including a small average pattern area ratio $\beta(i,j)$ is increased, preferably, a pattern in the circuit block is retained intact, and a dummy pattern is provided to a region which increases the size of the circuit block, while the pattern may be rearranged and a dummy pattern may be provided. When a mesh (i,j) having a pattern area ratio $\alpha_0(i,j)$ of 0 does not belong to a circuit block, preferably, a dummy pattern is provided all over within the mesh(i,j) if possible.

In the method of designing a mask pattern according to the first or fourth aspect of the present invention, or in the method of manufacturing an integrated circuit according to the first or fourth aspect of the present invention, examples of the (first layer)/(second layer) combination include (polysilicon layer doped with an impurity)/(insulation layer), (layer of a metal such as an aluminum alloy, tungsten, copper or silver)/(insulation layer), (layer of a metal compound such as tungsten silicide or titanium silicide)/(insulation layer), (stacked structure composed of a polysilicon layer doped with an impurity and a layer of a metal compound such as tungsten silicide or titanium silicide)/(insulation layer) and (stacked structure composed of a polysilicon layer doped with an impurity, a layer of a metal compound such as tungsten silicide or titanium silicide and an insulation film)/(insulation layer). Further, examples of the (first layer)/(second layer) combination include (insulation layer)/(polysilicon layer doped with an impurity), (insulation layer)/(layer of a metal such as an aluminum alloy, tungsten, copper or silver), (insulation layer)/(layer of a metal compound such as tungsten silicide or titanium silicide), (insulation layer)/(stacked structure composed of a polysilicon layer doped with an impurity and a layer of a metal compound such as tungsten silicide or titanium silicide) and (insulation layer)/(stacked structure composed of a polysilicon layer doped with an impurity, a layer of a metal compound such as tungsten silicide or titanium silicide and an insulation film).

In the method of designing a mask according to the second or fifth aspect of the present invention, or in the method of manufacturing an integrated circuit according to the second or fifth aspect of the present invention, the insulation layer is an insulation layer for example. The insulation layer includes insulation layers of known insulation materials such as $SiO_2$, BPSG, PSG, BSG, AsSG, SbSG, NSG, SOG, LTD (Low Temperature Oxide, low-temperature CVD-$SiO_2$), SiN or SiON or stacks composed of these insulation materials. In the method of designing a mask pattern according to the second or fifth aspect of the present invention, or in the method of manufacturing an integrated circuit according to the second or fifty aspect of the present invention, there is included an embodiment in which a CMP stopper layer is deposited on a substrate and the CMP stopper layer and the substrate are patterned. The CMP stopper layer can be composed of a material having a selectivity ratio of polishing with the layer. Examples of the CMP stopper layer include an SiN layer, a BN layer and a stacked structure of an SiN layer and a polysilicon layer.

In the method of designing a mask pattern according to any one of the first to sixth aspect of the present invention, or in the method of manufacturing an integrated circuit according to any one of the first to sixth aspect of the present invention, the term "mask pattern" means a pattern which is to be formed in a mask and has a size sufficient for one chip. The size of each mesh may be a size obtained by dividing the mask pattern, for example, to 100×100, while the size of the mesh shall not be limited thereto. Generally, a plurality of chips are produced on one wafer on the basis of lithography to which said mask is applied.

In the method of designing a mask pattern according to the first, second or third aspect of the present invention, or in the method of manufacturing an integrated circuit according to the first, second or third aspect of the present invention, the term "dummy pattern" means a pattern which does not constitute any circuit of an integrated circuit. The predetermined value $\beta_0$ which is compared with the average pattern area ratios $\beta(i,j)$ may be, for example, 0.8, while the predetermined value $\beta_0$ shall not be limited thereto and can be determined as required depending upon a mask pattern to be designed. When a mesh(i,j) where a dummy pattern is to be provided has a pattern area ratio $\alpha_0(i,j)$ of 0, a dummy pattern can be provided in the entire area of the mesh(i,j). In this case, the pattern area ratio $\alpha_0(i,j)$ of the mesh provided with the dummy pattern is 1. On the other hand, when a mesh(i,j) where a dummy pattern is to be provided has a pattern area ratio $\alpha_0(i,j)$ other than 0, the mesh can be provided with a dummy pattern which does not overlap a pattern and has a space, e.g., of 5 $\mu$m between the pattern and the dummy pattern. When the above space cannot be provided, or when the dummy pattern to be provided is too small (smaller than a size about twice as large as a minimum design size), it is not necessary to provide such dummy pattern.

In the method of designing a mask pattern according to the first, second or third aspect of the present invention, or in the method of manufacturing an integrated circuit according to the first, second or third aspect of the present invention, the steps (A) to (C) are carried out to provide a dummy pattern, and then the steps (A) to (C) may be repeated.

In the method of designing a mask pattern according to the fourth, fifth or sixth aspect of the present invention, or in the method of manufacturing an integrated circuit according to the fourth, fifth or sixth aspect of the present invention, preferably, the steps (A), (B) and (C) are repeated after a pattern is rearranged in a mask pattern. That is, specifically, $\alpha_0(i,j)$ and $\beta(i,j)$ are re-calculated so as to decrease the fluctuation of the average pattern area ratios $\beta(i,j)$, and preferably, the rearrangement of the pattern in the mask pattern is completed at a time when the fluctuation of the average pattern area ratios $\beta(i,j)$ converges on a constant value. When the rearrangement of the pattern includes an increase in the size of the circuit block (an increase in external dimensions of the circuit block), preferably, the unit of an increment of the size of the circuit block is an integer times or 1/an integer (a reciprocal of the integer) times as large as the size of the mesh in view of the simplification of the calculation.

The method of designing a mask pattern according to the first, second or third aspect of the present invention or in the method of manufacturing an integrated circuit according to the first, second or third aspect of the present invention is carried out, and then, the method of designing a mask pattern according to the fourth, fifth or sixth aspect of the present invention or in the method of manufacturing an integrated circuit according to the fourth, fifth or sixth aspect of the present invention may be carried out.

When the second layer is deposited in relation to the method of designing a mask pattern according to the first or fourth aspect of the present invention or in the method of manufacturing an integrated circuit according to the first or fourth aspect of the present invention, or when the layer is deposited in relation to the method of designing a mask pattern according to the second or fifth aspect of the present invention or in the method of manufacturing an integrated circuit according to the second or fifth aspect of the present invention, preferably, the second layer or the layer (to be sometimes described as "second layer (layer)" hereinafter) can be deposited by a CVD method. In this case, when the second layer (layer) is deposited by a CVD method in which the deposition is based on a surface reaction (conformal CVD method) or by a high-density plasma CVD method, a portion of the second layer (layer) having a projected shape and deposited on the pattern formed in the first layer or the substrate (to be sometimes described as "first layer (substrate)" hereinafter) differs in cross-sectional form in a perpendicular direction between these two methods. The portion of the second layer (layer) having a projected shape and deposited on the pattern formed in the first layer (substrate) is referred to as "projected portion of the second layer (layer)" hereinafter.

That is, when the second layer (layer) is deposited by a conformal CVD method, the second layer (layer) is deposited on the entire surface of the first layer (substrate), and the width of the projected portion of the second layer (layer) is, for example, approximately 2 to 2.6 times as large as the width of the pattern formed in the first layer (substrate). On the other hand, when the second layer (layer) is deposited by a high-density plasma CVD method, generally, the deposition of the second layer (layer) and the sputter-etching proceed concurrently, and a planing rate of the surface of the second layer (layer) by means of a bias applied to plasma particles and a deposition rate of the second layer (layer) are balanced. As the deposition of the second layer (layer) proceeds, side walls of the projected portion of the second layer (layer) formed on the pattern formed in the first layer (substrate) is planed thinner. As a result, the width of the projected portion of the second layer (layer) is therefore smaller than the width of the pattern formed in the first layer (substrate). That is, in any CVD method, the apparent value of the pattern area ratio $\alpha_0(i,j)$ of each mesh(i,j) may change.

In the method of designing a mask pattern according to the first or fourth aspect of the present invention, or in the method of manufacturing an integrated circuit according to the first or fourth aspect of the present invention, the pattern area ratio $\alpha_0(i,j)$ of each mesh(i,j) is preferably compensated on the basis of a pattern area increase ratio I determined by the thickness of the second layer to be deposited on the substrate including the patterned first layer or on the basis of a pattern area increase ratio I determined by the thickness of the pattern to be formed in the first layer and the thickness of the second layer to be deposited on the substrate including the patterned first layer, although the compensation depends upon a CVD method employed as a deposition method. In the above manner, a compensated pattern area ratio $\alpha_0(i,j)$ closer to a practical achievement can be obtained. In this case, the pattern area ratio $\alpha_0(i,j)$ of each mesh$(i,j)$ is preferably compensated on the basis of a pattern area increase amount $\Delta S$, $\Delta S$ being a pattern area increase amount determined by the thickness of the second layer to be deposited on the substrate including the patterned first layer or a pattern area increase amount determined by the thickness of the pattern to be formed in the first layer and the thickness of the second layer to be deposited on the substrate including the patterned first layer, $\Delta S$ being determined by multiplying I by L, L being a circumferential length of a portion of the second layer having a projected shape and being to be deposited on the pattern to be formed in the first layer.

In the method of designing a mask pattern according to the second or fifth aspect of the present invention, or in the method of manufacturing an integrated circuit according to the second or fifth aspect of the present invention, the pattern area ratio $\alpha_0(i,j)$ of each mesh$(i,j)$ is preferably compensated on the basis of a pattern area increase ratio I determined by the thickness of the layer to be deposited on the substrate or on the basis of a pattern area increase ratio I determined by the thickness of the pattern to be formed in the substrate and the thickness of the layer to be deposited on the substrate, although the compensation depends upon a CVD method employed as a method of depositing the layer. In the above manner, a compensated pattern area ratio $\alpha_0(i,j)$ closer to a practical achievement can be obtained. In this case, the pattern area ratio $\alpha_0(i,j)$ of each mesh$(i,j)$ is preferably compensated on the basis of a pattern area increase amount $\Delta S$, $\Delta S$ being a pattern area increase amount determined by the thickness of the layer to be deposited on the substrate or a pattern area increase amount determined by the thickness of the pattern to be formed in the substrate and the thickness of the layer to be deposited on the substrate, $\Delta S$ being determined by multiplying I by L, L being a circumferential length of a portion of the layer having a projected shape and being to be deposited on the pattern to be formed in the substrate.

When the second layer (layer) is deposited by a conformal CVD method, the side walls of the projected portion of the second layer (layer) formed on the pattern formed in the first layer (substrate) is nearly perpendicular. That is, the cross-sectional form of the projected portion of the said second layer (layer) in a perpendicular direction is conformal. Therefore, when the portion of the second layer (layer) having a projected shape and being to be deposited on the pattern to be formed in the first layer (substrate) has a vertical side wall, the pattern area increase ratio I can be determined on the basis of the following equation (4), $$I = X_0 \times (r_H / r_V) \quad (4)$$

wherein $X_0$ is a thickness of the second layer (layer) to be deposited, $r_H$ is a deposition rate of the second layer (layer) in a horizontal direction and $r_V$ is a deposition rate of the second layer (layer) in a vertical direction.

When the second layer (layer) is composed of a plurality of layers and each layer is formed by a conformal CVD method, a pattern area increase ratio I of each layer can be determined on the basis of the equation (4) and the obtained pattern area increase ratios I of these layers can be totaled.

On the other hand, when the second layer (layer) is formed by a high-density plasma CVD method, side walls of the projected portion of the second layer (layer) formed on the pattern formed in the first layer (substrate) tilt at an angle of $\theta$ from a horizontal direction. Therefore, when the portion of the second layer (layer) having a projected shape and being to be deposited on the pattern to be formed in the first layer (substrate) has an inclined side wall having an inclination angle of $\theta$ from a horizontal direction, the pattern area increase ratio I can be determined on the basis of the following equation (5), $$I = (h_0 - 2X_0) \cot \theta/2 \quad (5)$$

wherein $h_0$ is a thickness of the pattern to be formed in the first layer (substrate) and $X_0$ is a thickness of the second layer (layer) to be deposited.

When the second layer (layer) is composed of a plurality of layers and each layer is formed by a high-density CVD method, the pattern area increase ratio I of each layer can be determined on the basis of the equation (5) and the obtained pattern area increase ratios I of these layers can be totaled.

Further, when the second layer (layer) has a lower layer and an upper layer and a portion of the lower layer having a projected shape and being to be deposited on the pattern to be formed in the first layer (substrate) has an inclined side wall having an inclination angle of $\theta$ from a horizontal direction (that is, the lower layer is formed by a high-density plasma CVD method), and a portion of the upper layer to be deposited on the inclined side wall of the lower layer has an inclined surface having an inclination angle of $\theta$ from a horizontal direction (that is, the upper layer is formed by a conformal CVD method in which the deposition is based on a surface reaction), the pattern area increase ratio I can be determined on the basis of the following equation (6), $$I = (h_0 - 2Y_1) \cot \theta/2 + Y_2(r_{2H}/r_{2V} - \cos \theta)/\sin \theta \quad (6)$$

wherein $h_0$ is a thickness of the pattern to be formed in the first layer(substrate), $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

When the upper layer is composed of a plurality of layers, the second term of the right-side member of the equation (6) is determined on each layer and the obtained values are totaled so that the value of the pattern area increase ratio I can be obtained. The upper layer of the second layer (layer) can be formed not only by the above-mentioned CVD method but also by a method in which, for example, a high-density plasma CVD method used for forming the lower layer of the second layer (layer) is switched to a CVD condition for causing a surface reaction such that a sputtering rate is decreased and that a deposition rate is increased.

When the pattern area ratio $\alpha_0(i,j)$ of each mesh$(i,j)$ is compensated, there are some cases where a pattern to be formed, after a pattern area increase amount $\Delta S$ is taken into consideration, overlaps an adjacent pattern depending upon the pattern area increase amount $\Delta S$. That is, in some patterns, a boundary line which defines a circumferential length L of a projected portion of the second layer (layer) deposited on the pattern comes into a projected portion of the second layer (layer) deposited on an adjacent pattern. In the above case, a plurality of adjacent patterns may be considered as one pattern in the arrangement.

In the method of designing a mask pattern or the method of manufacturing an integrated circuit according to the present invention, the average pattern area ratio $\beta(i,j)$ is determined within a predetermined region including a mesh $(i,j)$ as the central point. When the obtained average pattern area ratio $\beta(i,j)$ is less than a predetermined value $\beta_0$, a dummy is provided to the mesh(i,j), or a pattern in a mask pattern is rearranged, for example, with regard to each circuit block as a unit so as to decrease the fluctuation of the average pattern area ratios $\beta(i,j)$. As a result, a pattern area ratio $\alpha'$ of a pattern to be formed in the first layer, the substrate or the starting substrate can be unified, and the flattening treatment of the second layer, the layer or the starting substrate can be uniformly and reliably carried out. Further, the CMP process requires no additional steps.

When it is attempted to unify the pattern area ratios $\alpha_0(i,j)$ of meshes(i,j), the following problems are caused. When the mesh size is decreased to approximately 100 $\mu$m×100 $\mu$m, it is sometimes difficult to form a pattern having a desired specification, or it is difficult to properly arrange a pattern itself. In the present invention, however, there are introduced concepts of the pattern area ratios $\alpha_0(i,j)$ and the average pattern area ratio $\beta(i,j)$ based on the pattern area ratios of the meshes in a peripheral area (for example, a region having a size of 2 mm×2 mm) surrounding the mesh(i,j), so that the above problems can be overcome. That is, the present invention can attain both a demand that the mesh size be decreased and a demand that the effect of a region around a mesh(i,j) be reflected.

Further, when the pattern area ratio $\alpha_0(i,j)$ of each mesh (i,j) is compensated, the pattern area ratios $\alpha_0(i,j)$ closer to a practical achievement can be obtained.

DESCRIPTION OF THE PREFERRED EMBODIMENT(S)

Embodiments of the present invention will be explained with reference to drawings hereinafter, while the background of the present invention will be first explained below.

Figure 10A:
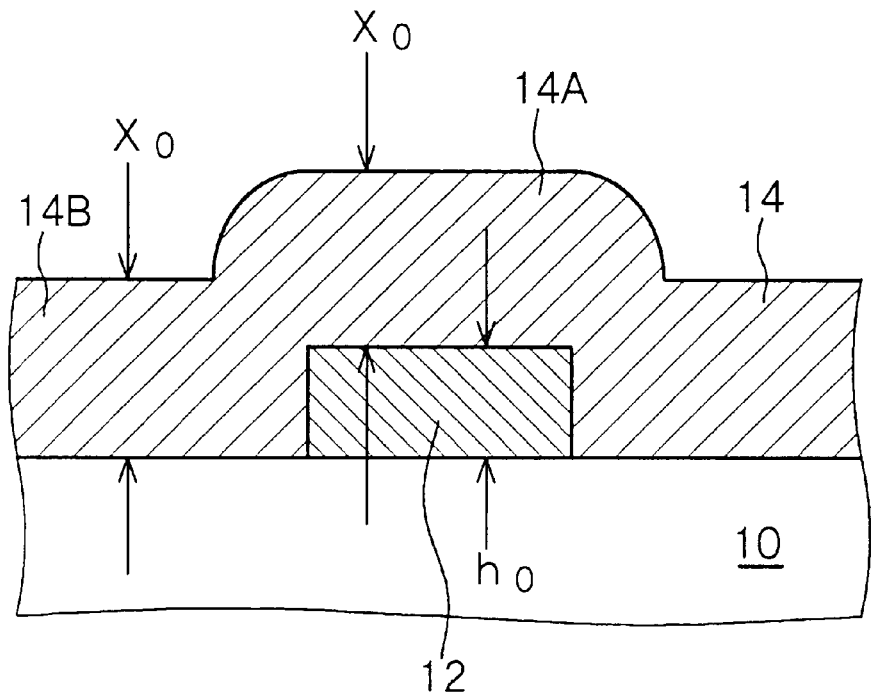
FIGS. 10A and 10B schematically show states where a second layer is polished by a chemical/mechanical polishing process.
Figure 10B:
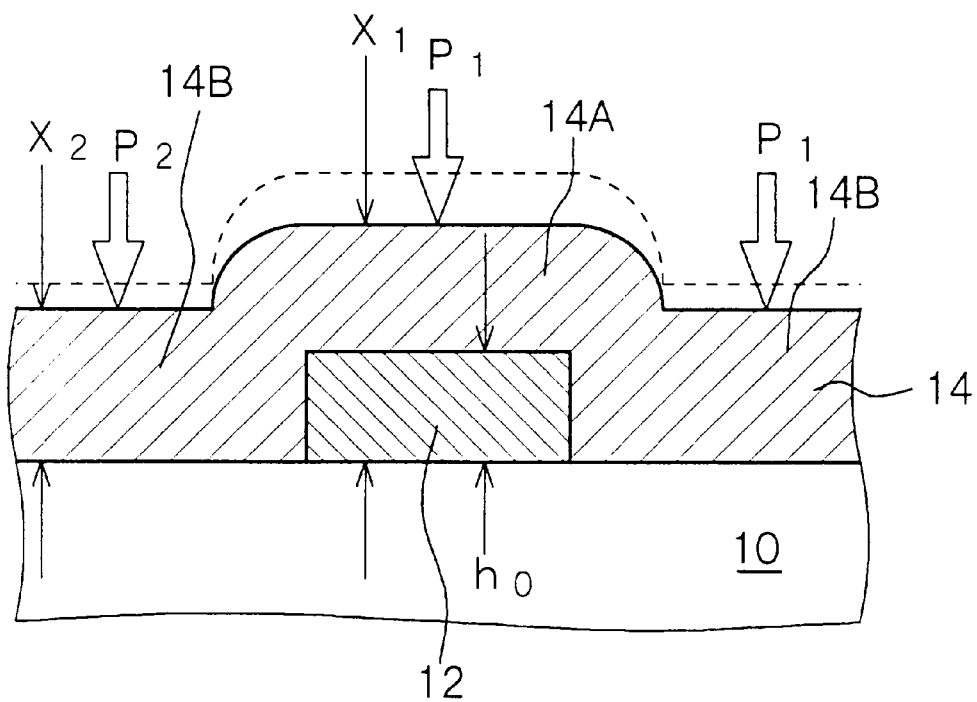

For example, as shown in FIG. 10A, a patterned first layer 12 (thickness $h_0$) is deposited on an underlayer 10, and a second layer 14 having a thickness of $X_0$ is deposited on the entire surface. The surface of the second layer 14A on the first layer 12 has a height of $(h_0+X_0)$, and the surface of the second layer 14B on the underlayer 10 a height of $X_0$. The height is measured from the surface of the underlayer 10, and is also used in this sense hereinafter. For example, as shown in FIG. 10B, the second layer 14 is polished, and as a result, the surface of the second layer 14A on the first layer 12 has a height of $X_1$, and the surface of the second layer 14B on the underlayer 10 has a height of $X_2$. Further, the polishing pad of the polishing apparatus exerts a pressure $P_1$ on the second layer 14A and exerts a pressure $P_2$ on the second layer 14B. The pressure $P_1$ and $P_2$ are functions of polishing time t and are to be expressed as $P_1(t)$ and $P_2(t)$, while they are expressed as $P_1$ and $P_2$ for the convenience. As a basic theory of polishing, the law of Preston is found. This law is based on the assumption that the polishing rate is in proportion to a frictional work per unit area-time. The polishing rate is expressed by the following equation (7), $$-dX/dt = cvP \tag{7}$$

wherein v is a relative velocity of the surface of the substrate which is polished and the polishing plate, P is a pressure (constant value during the polishing regardless of a polishing time t), X is a remaining height of the surface of the second layer 14, and c is a constant.

The first layer 12 which is patterned is assumed to have an area $S_1$, a portion of the second layer 14 deposited on the underlayer 10 is assumed to have an area $S_2$ and an average value of pressure exerted on the entire surface is assumed to be P. In this case, the following equation (8) can be introduced on the basis of a force balance. Further, the equation (8) can be modified to an equation (9).

$$S_1 P_1 + S_2 P_2 = (S_1 + S_2) P \tag{8}$$

$$kP_1 + (1-k)P_2 = P \tag{9}$$

In the equation (9), $k = S_1/(S_1+S_2)$. Meanwhile, the polishing pad is in contact with the second layer 14 in a considerable area of the second layer 14. Therefore, the value of k can be replaced with an average pattern area ratio $\beta(i,j)$ of the mesh(i,j). Therefore, the equation (9) can be further modified to the following equation (10). In the following equations, the average pattern area ratio $\beta(i,j)$ is expressed as $\beta_{ij}$ for the convenience.

$$\beta_{ij}P_1+(1-\beta_{ij})P_2=P \tag{10}$$

When the above polishing pad is assumed to have a Young's modulus of E and a thickness of T, the relationship between $P_1$ and $P_2$ can be as shown by the following equation (11).

$$P_1-P_2=(E/T)(X_1-X_2) \tag{11}$$

When the equation (7) is applied to the remaining heights $X_1$ and $X_2$ of the surfaces of the second layer 14A on the first layer 12 and the second layer 14B on the underlayer 10, the following equations (12-1) and (12-2) are established.

$$-dX_1/dt=cvP_1 \tag{12-1}$$

$$-dX_2/dt=cvP_2 \tag{12-2}$$

On the basis of the equations (10) and (11), $P_1$ and $P_2$ are determined as functions of $X_1$ and $X_2$, and $P_1$ and $P_2$ are substituted into the equations (12-1) and (12-2), to obtain simultaneous linear differential equations which are inhomogeneous. These simultaneous linear differential equations which are inhomogeneous are solved to give the following equations (13-1) and (13-2).

$$X_1=X_0+\beta_{ij}h_0-cvPt+(1-\beta_{ij})h_0\exp[-(cvE/T)t] \tag{13-1}$$

$$X_2=X_0+\beta_{ij}h_0-cvPt-\beta_{ij}h_0\exp[-(cvE/T)t] \tag{13-2}$$

The height H(i,j) of the surface of the portion of the second layer 14 corresponding to the mesh(i,j) of a mask pattern from the surface of the underlayer 10 can be expressed by the following equation (14). The pattern area ration $\alpha_0(i,j)$ of the mask pattern is expressed as $\alpha_{ij}$ for the convenience.

$$H(i,j)=\alpha_{ij}X_1+(1-\alpha_{ij})X_2 \tag{14}$$

The following equation (15) can be obtained from the equations (14), (13-1) and (13-2). Further, the equation (15) can be modified to obtain an equation (16).

$$H(i,j)=X_0+\beta_{ij}h_0-cvPt+(\alpha_{ij}-\beta_{ij})h_0\exp[-(cvE/T)t] \tag{15}$$

$$H(i,j)=X_0-cvPt+\alpha_{ij}h_0\exp[-(cvE/T)t]+\beta_{ij}h_0(1-\exp[-(cvE/T)t]) \tag{16}$$

The value of H(i,j) at a time (t=0) when the polishing of the second layer 14 is initiated is as shown by the following equation (17-1) on the basis of the equation (16). On the other hand, the value of H(i,j) at a time (t=t') when the polishing of the second layer 14 is finished can be approximated as shown by the following equation (17-2) on the basis of the equation (16).

$$H_{START}(i,j)=X_0+\alpha_{ij}h_0 \tag{17-1}$$

$$H_{END}(i,j)=X_0-cvPt'+\beta_{ij}h_0 \tag{17-2}$$

The equations (17-1) and (17-2) show that the height $H_{END}(i,j)$ of the surface of the second layer 14 at a time when the polishing of the second layer 14 is finished depends upon the average pattern area ratio $\beta(i,j)$. When the mask pattern to be formed in a mask is designed, a dummy pattern is provided to a mesh(i,j) having an average pattern area ratio $\beta(i,j)$ smaller than a predetermined value $\beta_0$ or a pattern in the mask pattern is rearranged so as to decrease the fluctuation of the average pattern area ratios $\beta(i,j)$, whereby the pattern area ratio of a pattern to be formed in the first layer, the substrate or the starting substrate can be unified, and the flattening treatment of the second layer, the layer or the starting substrate can be uniformly and reliably carried out.

EXAMPLE 1

Example 1 is directed to the method of designing a mask pattern to be formed in a mask for use with a lithography process according to the first, second or third of the present invention. That is, Example 1 is concerned with a method of designing a mask pattern to be formed in a mask used for manufacturing an integrated circuit (1) by forming a pattern in a first layer deposited on a substrate, on the basis of lithography to which said mask is applied, then depositing a second layer on the substrate including the patterned first layer and flattening the second layer by a chemical/mechanical polishing process, or (2) by forming a pattern in a substrate, on the basis of lithography to which said mask is applied, then depositing a layer on the substrate and flattening the layer by a chemical/mechanical polishing process, or (3) by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process.

In Example 1, meshes having the form of a lattice have a predetermined size of $100 \mu m \times 100 \mu m$. Average pattern area ratios $\beta(i,j)$ were determined on the basis of the following equations (1-1) and (1-2). In the equation (1-1), 10 was used as a value of m, and 9 was used as a value of Q. That is, a predetermined region of a mask pattern including a mesh(i,j) as the central point in the predetermined region has a size of $2100 \mu m \times 2100 \mu m$. In other words, the average pattern area ration $\beta(i,j)$ is determined as an average of pattern area ratios within a $2100 \mu m \times 2100 \mu m$ region including the mesh(i,j) as the central point. Further, the value of $\alpha_{q+1}(i,j)$ was smoothed (averaged) 10 times. Generally, since a plurality of chips are produced on one wafer with the mask, when a position of a mesh (i+1,j+k) in the equation (1-1) deviates from the mask pattern of one chip, a corresponding pattern area ratio $\alpha_0$ in the region of a mask pattern of one adjacent chip may be used. Further, 0.9 was used as a predetermined value $\beta_0$ in the average pattern area ratios $\beta(i,j)$. Alternatively, a value of [{maximum value of $\beta(i,j)$}−1] may be used as a predetermined value of $\beta_0$. When the above value is used as a predetermined value of $\beta_0$, the value of $\beta_0$ changes after a dummy pattern is provided. It is therefore preferred to repeat the steps (A), (B) and (C), and the arrangement of the dummy patterns can be therefore more optimized.

$$\alpha_{q+1}(i,j) = \sum_{l=-m}^{l=m} \sum_{k=-m}^{k=m} \alpha_q(i+l,j+k)/(2m+1)^2 \tag{1-1}$$

$$\beta(i,j) = \alpha_{Q+1}(i,j) \tag{1-2}$$

wherein q=0, 1, 2, ..., Q.

Figure 1A:
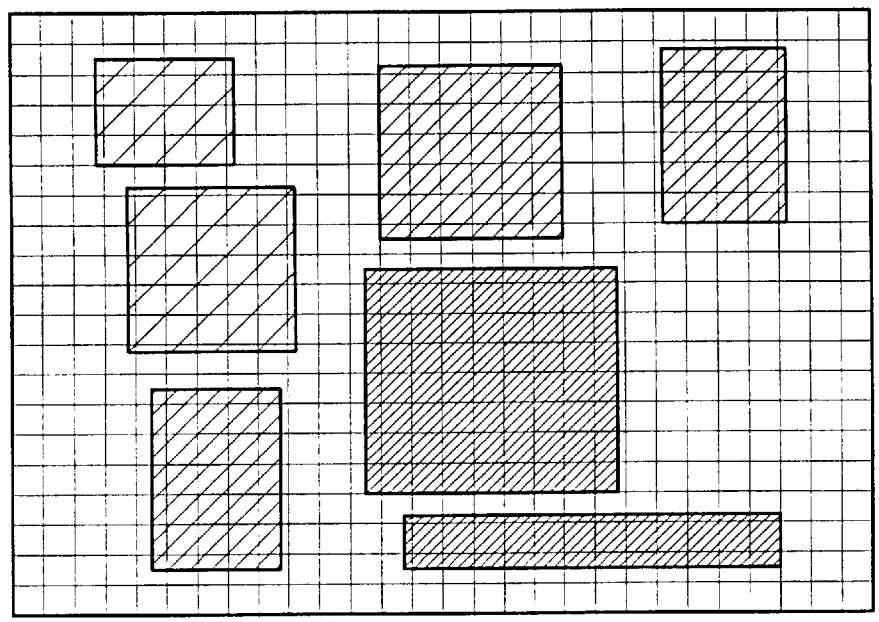
FIGS. 1A and 1B are schematic plan views for explaining the method of designing a mask pattern in Example 1.
Figure 1B:
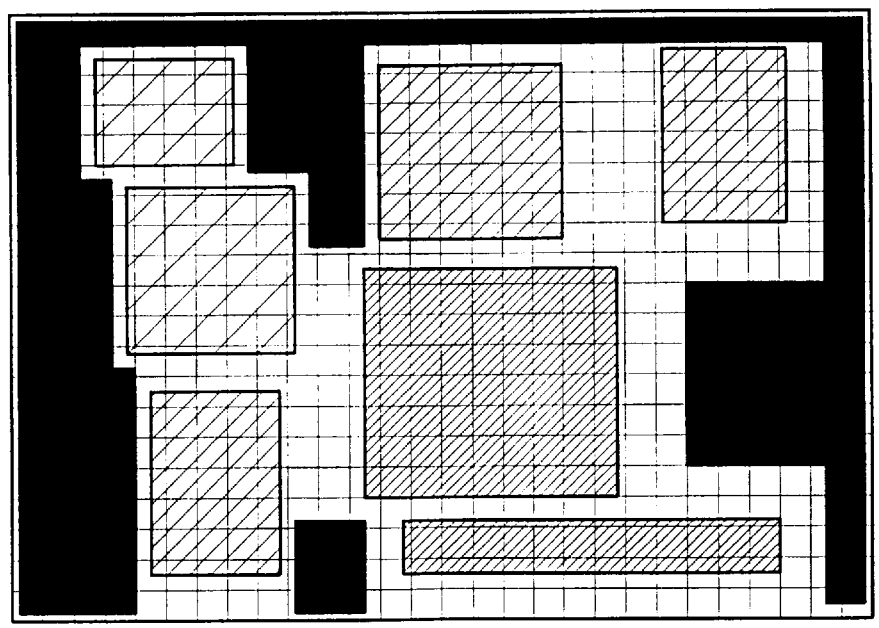
Figure 2:
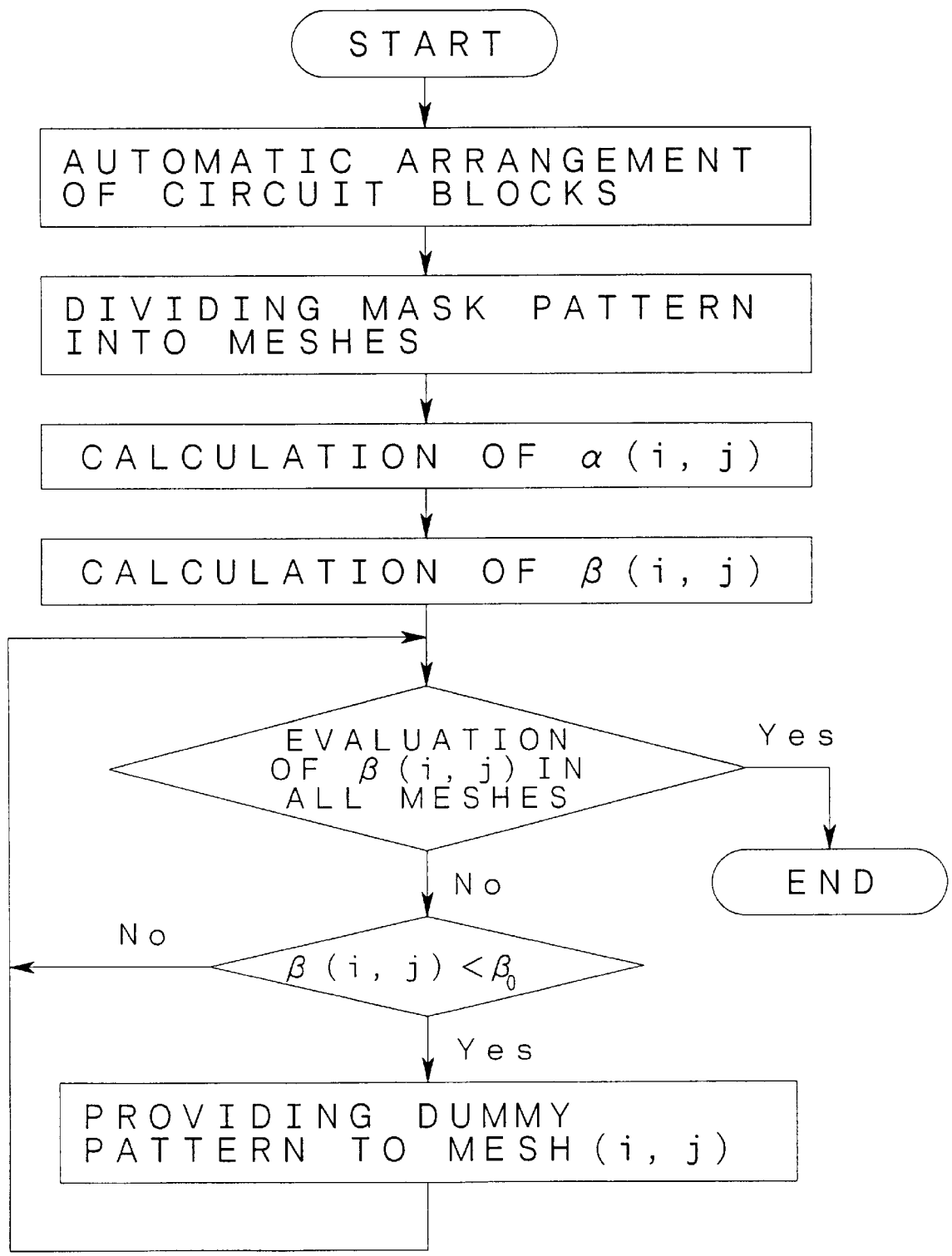
FIG. 2 shows a flow chart of the method of designing a mask pattern in Example 1.

FIG. 2 shows the flow chart of steps of the method of designing a mask pattern in Example 1. In Example 1, the circuit blocks designed in advance are first automatically arranged on the basis of a known algorithm such that a chip area is minimized. That is, the area of one chip is minimized by arrange circuit block-circuit block distances to be as small as possible. FIG. 1A schematically shows the so-obtained arrangement of the circuit blocks. In this state, there are included circuit blocks having a larger number of patterns and circuit blocks having a smaller number of patterns. When a mask pattern for obtaining the above patterns is divided into meshes having the form of a lattice and having a size of 100 μm×100 μm each and pattern area ratios $α_0(i,j)$ are determined one by one with regard to the meshes(i,j), the pattern area ratios $α_0(i,j)$ are greatly fluctuate. In FIGS. 1A and 1B, rectangular regions surrounded by thick lines show the circuit blocks, and the circuit blocks having higher pattern area ratios are indicated by hatching more densely. Further, squares formed by vertical lines and horizontal lines indicate meshes.

FIG. 1B schematically shows a state in which meshes(i,j) in which $β(i,j)<0.9(=β_0)$ are provided with dummy patterns after the average pattern area ratios $β(i,j)$ are determined based on the equations (1-1) and (1-2). In FIG. 1B, the dummy patterns are blackened.

A mask used in a lithography process can be produced on the basis of the above-designed mask pattern according to a known method. If the mask produced on the basis of the above design method is used to form a pattern in the first layer (or substrate or starting substrate), the fluctuation of pattern area ratio α' of the patterns formed in the first layer (or substrate or starting substrate) decreases when a chip is taken as a whole. Therefore, after a second layer (layer) is deposited on the entire surface, or after two substrates are bonded, and when the second layer (or layer or starting substrate) is flattened by a CMP process for manufacturing an integrated circuit, the flattening treatment of the second layer (or layer or starting substrate) can be uniformly and reliably carried out.

EXAMPLE 2

Example 2 is directed to the method of manufacturing an integrated circuit according to the first aspect of the present invention. That is, Example 2 uses a mask produced on the method of designing a mask pattern explained in Example 1, to form a pattern in a first layer deposited on a substrate. Then, a second layer is deposited on the entire surface, then, the second layer is flattened by a CMP process, and an integrated circuit is manufactured. The method of manufacturing an integrated circuit in Example 2 will be explained with reference to FIGS. 3A to 3D hereinafter.

Figure 3A:
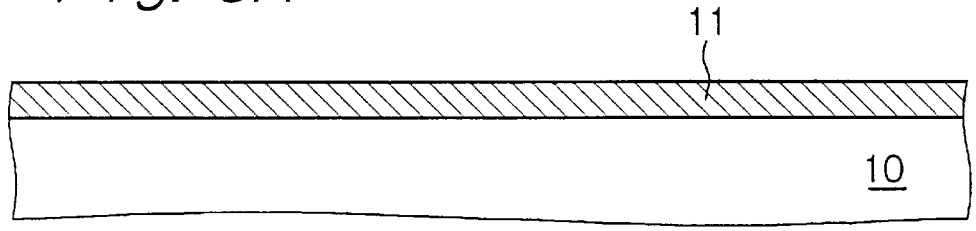
FIGS. 3A to 3D are schematic partial cross-sectional views of a first layer, etc., for explaining the method of manufacturing an integrated circuit in Example 2.
Figure 3B:
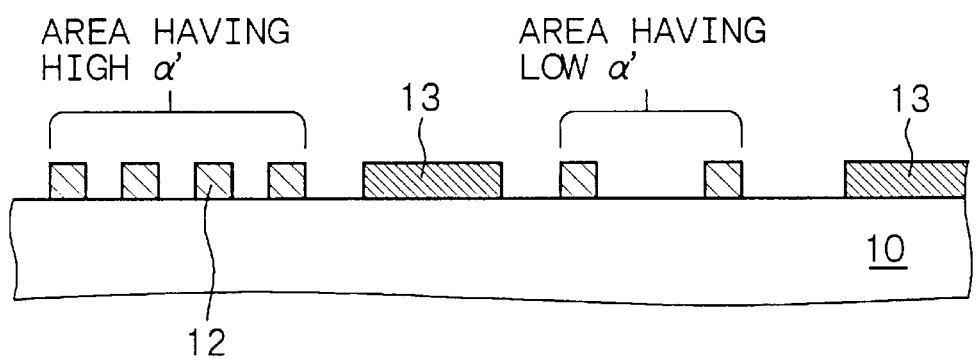

As shown in the schematic partial cross-sectional view of FIG. 3A, first, a first layer 11 formed of, for example, polysilicon doped with an impurity is deposited on a flattened underlayer 10 formed of, for example, $SiO_2$, e.g., by a CVD method. Then, a pattern is formed in the first layer 11 by lithography using a mask produced on the basis of the method of designing a mask pattern explained in Example 1 and by etching (see FIG. 3B). Reference numeral 12 indicates a patterned first layer. The patterned first layer 12 has a region having a high pattern area ratio α' and a region having a low pattern area ratio α'. The mask has dummy patterns, and a dummy pattern 13 of the first layer is also formed concurrently. The patterned first layer 12 works, e.g., as a wiring.

Figure 3C:
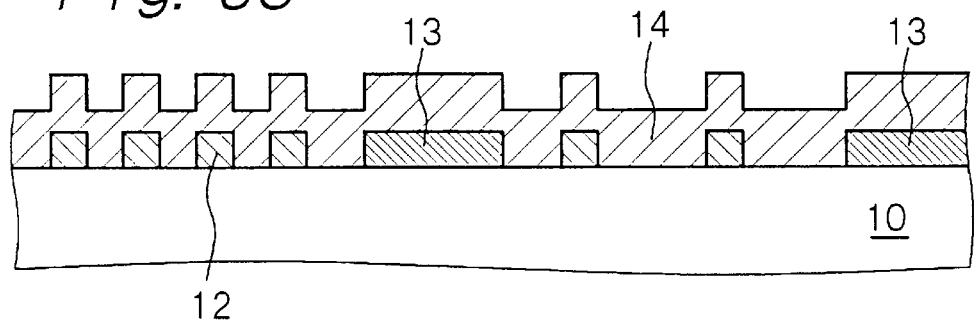

Then, a second layer 14 (for example, insulation layer composed of $SiO_2$) is deposited on the entire surface by a CVD method (see FIG. 3C). Then, the second layer 14 is flattened by a CMP process using, for example, the polishing apparatus shown in FIG. 11 (see FIG. 3D). Even when the pattern area ratios α' in the first layer 12 greatly fluctuate, the second layer 14 can be uniformly polished since the dummy patterns 13 are formed. As a result, the occurrence of a so-called dishing can be effectively prevented, and the second layer 14 which is flattened can be easily and reliably obtained.

EXAMPLE 3

Figure 3D:
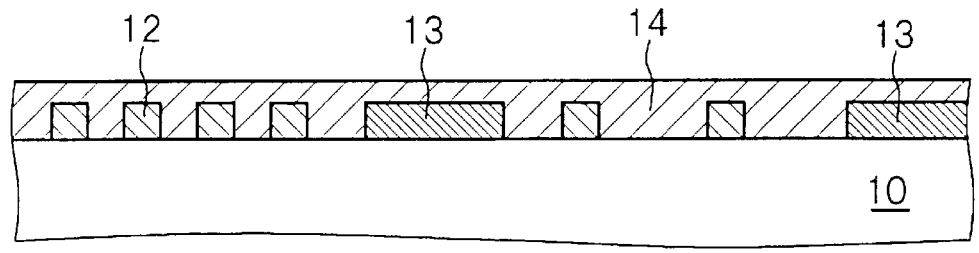

Example 3 is a variant of Example 2. In Example 2, as shown in FIG. 3D, the second layer is retained on the patterned first layer 12. On the other hand, in Example 3, no second layer is retained on the patterned first layer 12. According to the method of manufacturing an integrated circuit in Example 3, for example, a buried (embedded) wiring can be formed. The method of manufacturing an integrated circuit in Example 3 will be explained with reference to FIGS. 4A to 4D hereinafter.

Figure 4A:
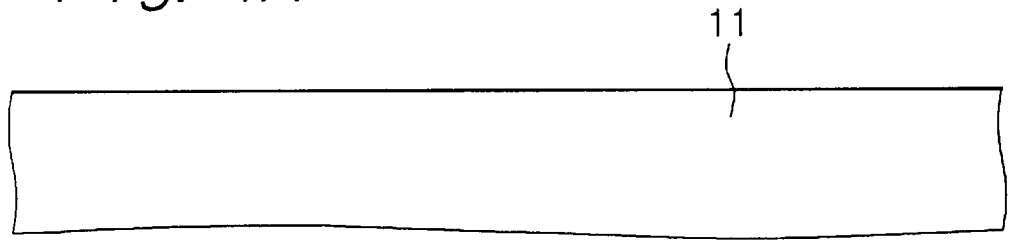
FIGS. 4A to 4D are schematic partial cross-sectional views of a first layer, etc., for explaining the method of manufacturing an integrated circuit in Example 3.
Figure 4B:
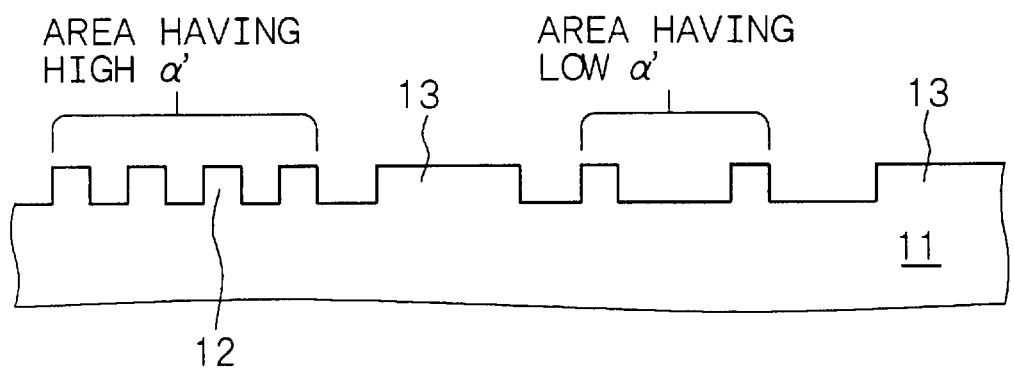
Figure 4C:
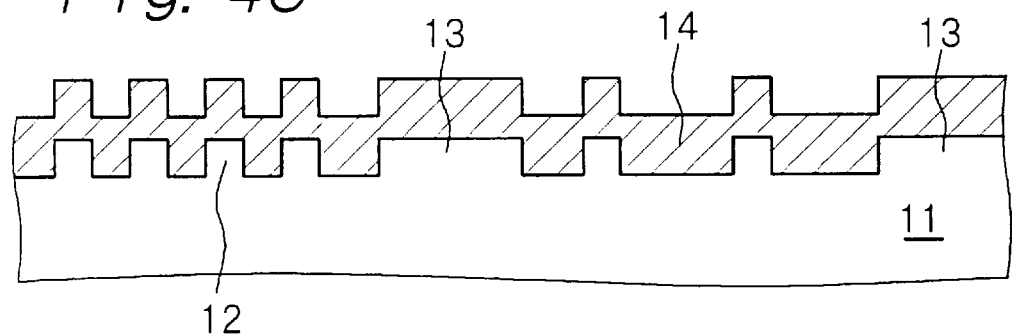

As shown in the schematic partial cross-sectional view of FIG. 4A, first, a first layer 11 composed of, for example, $SiO_2$ is deposited on a flattened underlayer (not shown) composed of, for example, $SiO_2$ by a CVD method. Then, a pattern is formed in the first layer 11 by lithography using a mask produced on the basis of the method of designing a mask pattern explained in Example 1 and by etching (see FIG. 4B). The above pattern is, for example, a concave portion (groove portion) formed in the first layer 11. The mask has a dummy pattern, and a dummy pattern 13 is also formed concurrently in the first layer 11.

Figure 4D:
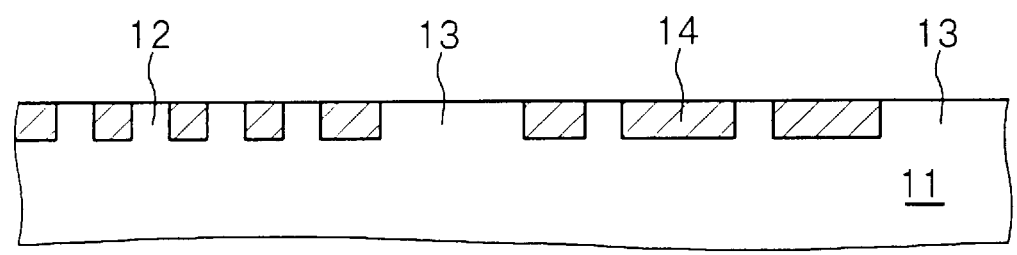
Figure 11:
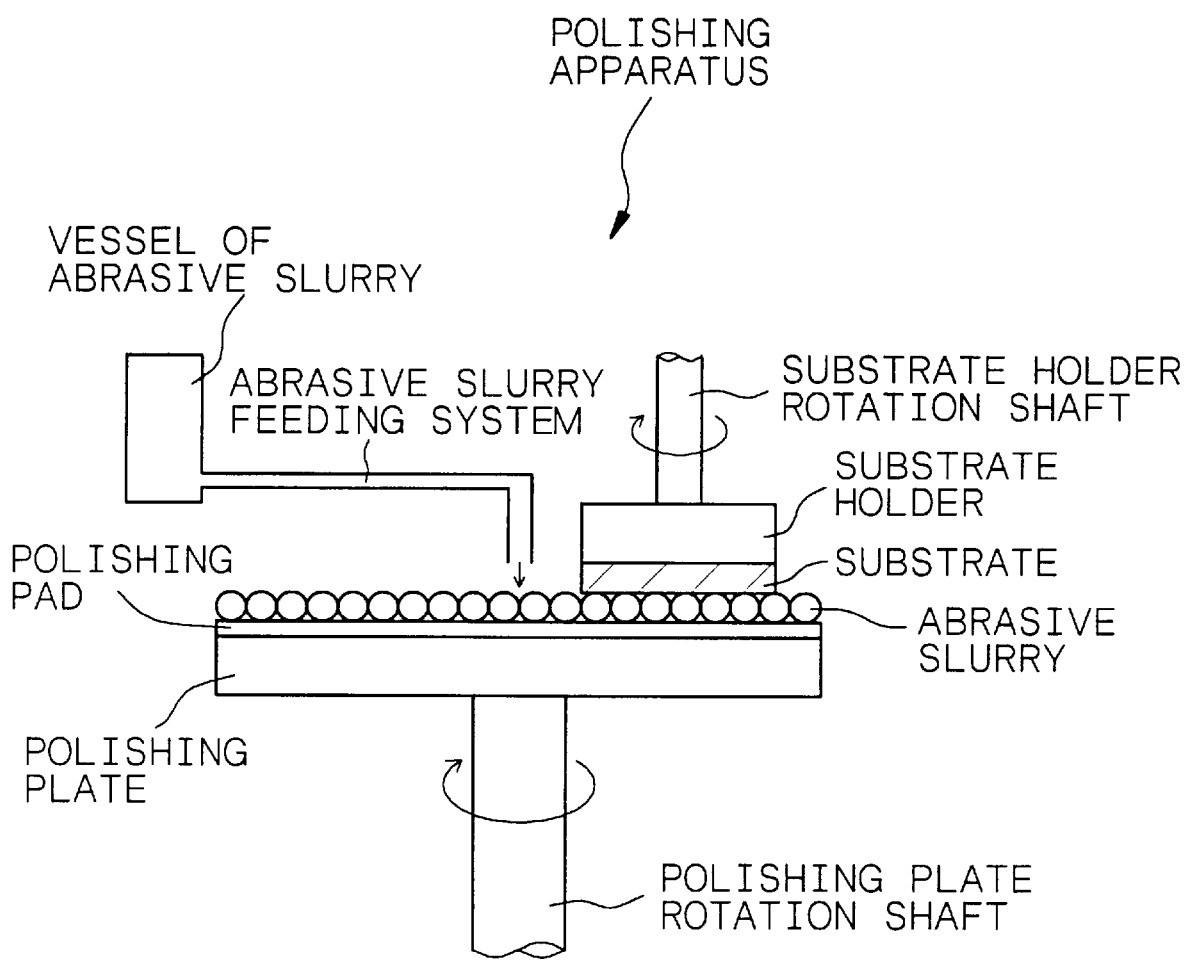
FIG. 11 schematically shows a polishing apparatus for use with a chemical/mechanical polishing process.

Then, a second layer 14 (for example, metal wiring material layer) is deposited on the entire surface, e.g., by a CVD method or a sputtering method (see FIG. 4C), and the second layer 14 is flattened by a CPM process using, for example, the polishing apparatus shown in FIG. 11 (see FIG. 4D). In Example 3, the second layer 14 is flattened by a CMP process such that the surface of the patterned first layer 12 is exposed. Even when there is a great fluctuation in pattern area ratios α' in the patterned first layer 12, the second layer 14 can be uniformly polished since the dummy pattern 13 is formed. As a result, the surface of the exposed first layer 12 is not deeply polished, and therefore, the excessive polishing of the surface of the first layer 11 can be effectively prevented, or the excessive polishing of the second layer 14 can be also effectively prevented.

EXAMPLE 4

Example 4 is directed to the method of manufacturing an integrated circuit according to the second aspect of the present invention. That is, a mask produced by the method of designing a mask pattern explained in Example 1 is used to form a pattern in a substrate. Then, a layer is deposited on the entire surface and flattened by a CMP process, and an integrated circuit is manufactured. The method of manufacturing an integrated circuit will be explained with reference to FIGS. 5A to 5D hereinafter.

Figure 5A:
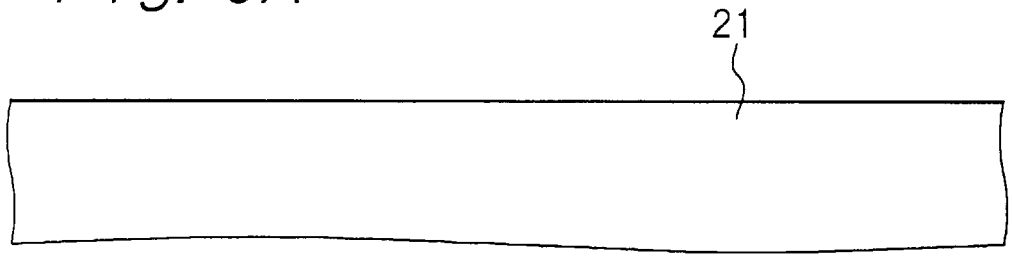
FIGS. 5A to 5D are schematic partial cross-sectional views of a substrate, etc., for explaining the method of manufacturing an integrated circuit in Example 4.
Figure 5B:
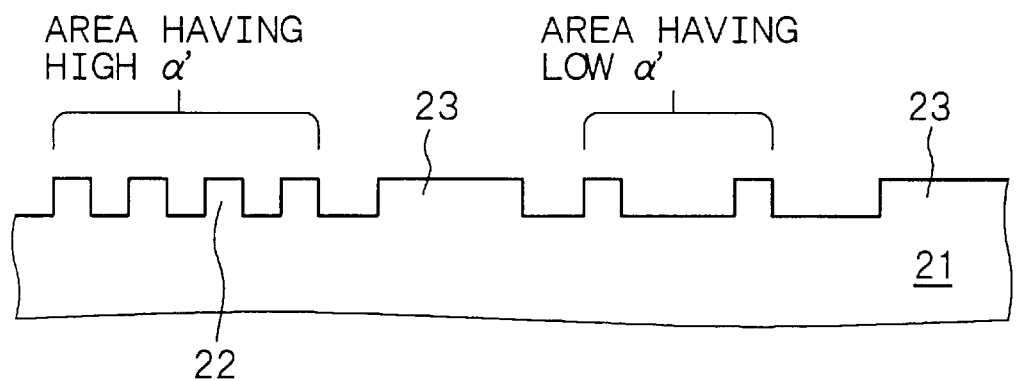
Figure 5C:
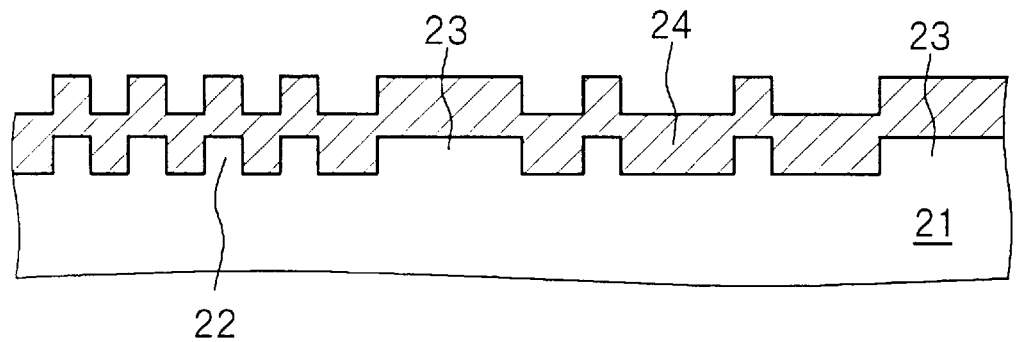

First, a pattern is formed in the surface of a substrate 21 composed of, for example, a silicon semiconductor substrate, shown in the schematic partial cross-sectional view of FIG. 5A, by lithography using a mask produced on the basis of the method of designing a mask pattern explained in Example 1 and by etching (see FIG. 5B). Reference numeral 22 indicates a patterned substrate portion. The pattern is, for example, a concave portion (groove portion) formed in the substrate 21. Since the mask has a dummy pattern, a dummy pattern 23 is also formed in the substrate 21 concurrently.

Figure 5D:
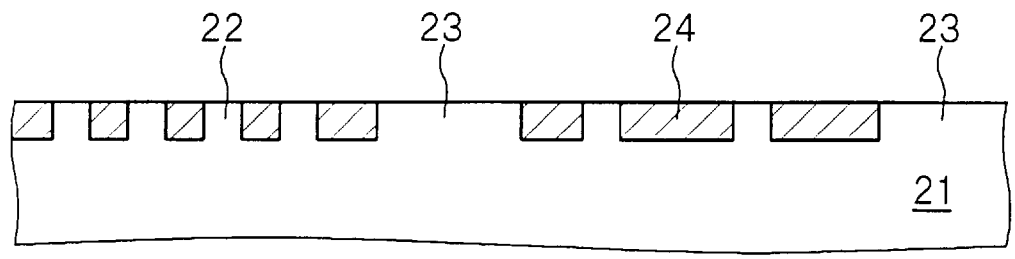

Then, a layer 24 (for example, insulation layer composed of $SiO_2$) is deposited on the entire surface, e.g., by a CVD method (see FIG. 5C), and the layer 24 is flattened by a CPM process using, for example, the polishing apparatus shown in FIG. 11 to expose the surface of the substrate 21 (see FIG. 5D). In this manner, for example, there can be formed a device separation region having a trench structure, in which the layer 24 composed of $SiO_2$ is embedded in the concave portion formed in the surface of the substrate 21. Even when there is a great fluctuation in pattern area ratios α' in that region 22 of the substrate 21 where the patterns are formed, the layer 24 can be uniformly polished since the dummy pattern 23 is formed. Therefore, the occurrence of a so-called dishing can be effectively prevented, and the layer 24 which is flattened can be easily and reliably obtained.

EXAMPLE 5

Example 5 is directed to the method of manufacturing an integrated circuit according to the third aspect of the present invention. That is, a mask produced by the method of designing a mask pattern explained in Example 1 is used to form a pattern in a starting substrate. Then, the front surface of the starting substrate and a supporting substrate are bonded to each other, then, the starting substrate is flattened from its back surface by a CMP process, and an integrated circuit is manufactured. The method of manufacturing an integrated circuit in Example 5 will be explained with reference to FIGS. 6A to 6C hereinafter.

Figure 6A:
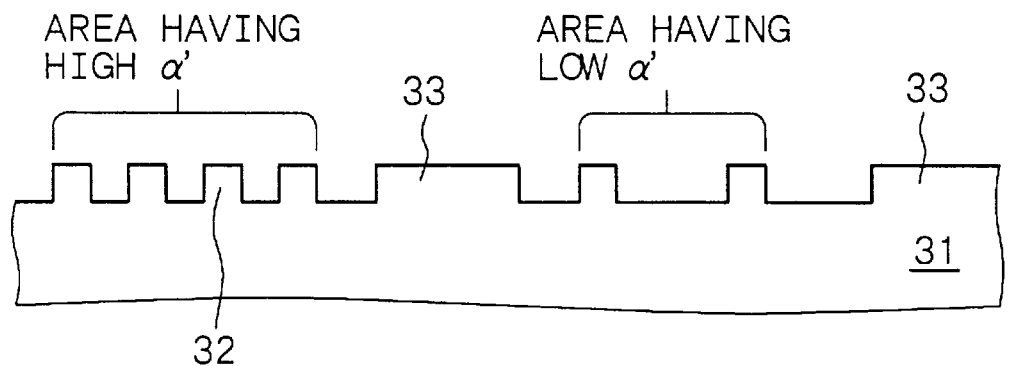
FIGS. 6A to 6C are schematic partial cross-sectional views of a substrate, etc., for explaining the method of manufacturing an integrated circuit in Example 5.
Figure 6B:
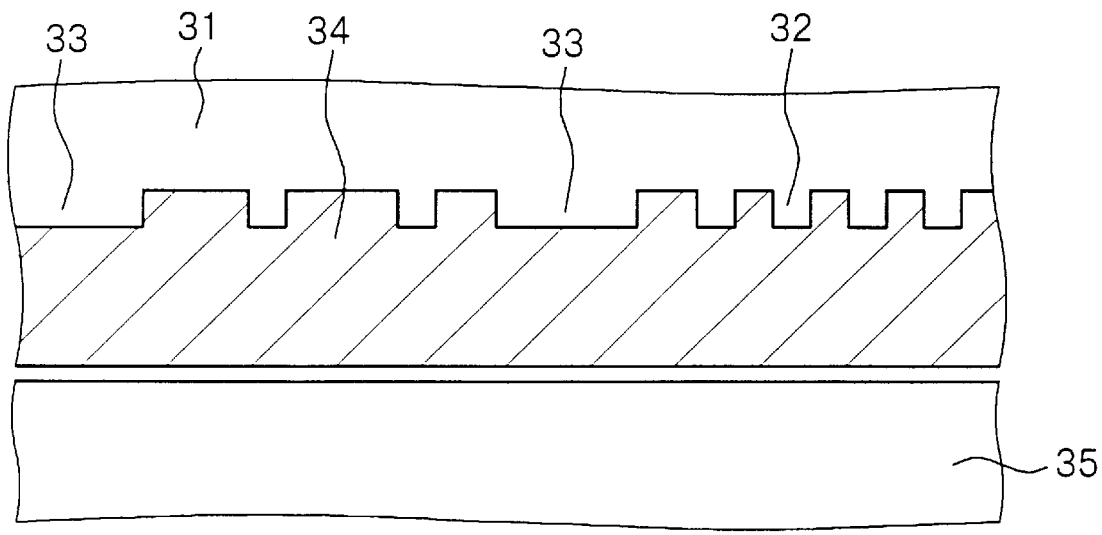

First, a pattern is formed in the surface of a starting substrate 31 composed of, for example, a silicon semiconductor substrate, shown in the schematic partial cross-sectional view of FIG. 6A, by lithography using a mask produced on the basis of the method of designing a mask pattern explained in Example 1 and by etching. Reference numeral 32 indicates a patterned starting substrate portion. Since the mask has a dummy pattern, a dummy pattern 33 is also formed in the starting substrate 31 concurrently.

Then, the front surface of the starting substrate 31 and a supporting substrate 35 are bonded to each other. Specifically, an insulation layer 34 composed of, for example, $SiO_2$ is deposited on the entire front surface of the starting substrate 31, and the insulation layer 34 is flattened. Then, a polysilicon layer (not shown) is deposited on the insulation layer 34 as required. And, a mirror-polished supporting substrate 35 composed of, for example, a silicon semiconductor substrate and the mirror-polished surface (surface of the insulation layer 34, etc.) of the starting substrate 31 are attached to each other, and the resultant laminate is heat-treated around 900° C., whereby a molecular-level or atomic-level bonding state can be obtained (see FIG. 6B).

Figure 6C:
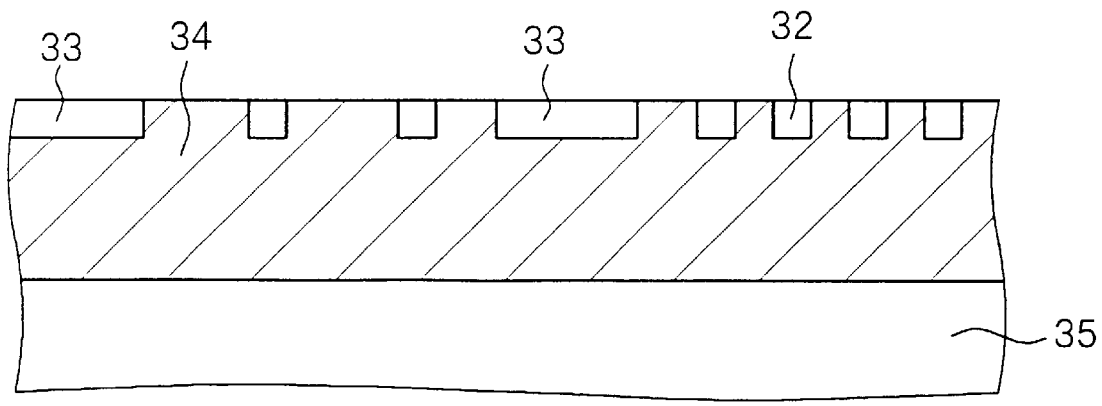

Then, the starting substrate 31 is flattened from its back surface by a CMP process using, for example, the polishing apparatus shown in FIG. 11, to expose the surface of the insulation layer 34 (see FIG. 6C). In the above manner, there can be formed a so-called SOI substrate in which part of the starting substrate 31 is retained between the insulation layers 34 embedded in the patterns formed in the surface of the starting substrate 31. Even when there is a great fluctuation in pattern area ratios α' in that region 32 of the starting substrate 31 where the pattern is formed, the starting substrate 31 can be uniformly polished from its back surface since the dummy pattern 33 is formed. Therefore, the occurrence of a so-called dishing can be effectively prevented, and the SOI substrate which is flattened can be easily and reliably obtained.

EXAMPLE 6

Example 6 is a variant of the method of designing a mask pattern according to the first aspect of the present invention. When an underlayer is sufficiently flat, it is not required to compensate the pattern area ratios $\alpha_0(i,j)$ of the mask pattern in a mask used for patterning the first layer. However, when the underlayer provided under the first layer is not sufficiently flat, it is preferred to determine the pattern area ratios $\alpha_0(i,j)$ by taking into account an influence caused by a difference in level arising in the underlayer (a stepwise height difference of the underlayer), i.e., by incorporating a compensation of the stepwise height difference of the underlayer.

That is, in Example 6, when the pattern area ratios $\alpha_0(i,j)$ of the meshes(i,j) are determined, values of pattern area ratios $\alpha_U(i,j)$ or values of average pattern area ratios $\beta_U(i,j)$ of a mask pattern in a mask used for forming a pattern in the underlayer provided under the first layer are incorporated. More specifically, the pattern area ratio of a mesh(i,j) when no underlayer is assumed to be absent is $\alpha_S(i,j)$. The difference in level (a stepwise height difference) arising in the first layer, to which the thickness of the first layer corresponds, after the formation of the pattern in the first layer is $h_S$, and the difference in level (a stepwise height difference) arising in the underlayer is $h_U$ (see FIG. 7A). When the underlayer is not flattened by a CMP process, the pattern area ratios $\alpha_0(i,j)$ of meshes(i,j) are determined on the basis of the following equation (2). When the underlayer is flattened by a CMP process, the pattern area ratios $\alpha_0(i,j)$ of meshes(i,j) are determined on the basis of the following equation (3).

$$\alpha_0(i,j)=\alpha_S(i,j)+(h_U/h_S)\cdot\alpha_U(i,j) \quad (2)$$

$$\alpha_0(i,j)=\alpha_S(i,j)+(h_U/h_S)\cdot\beta_U(i,j) \quad (3)$$

Meanwhile, when the flattening process of the second layer (layer) is three-dimensionally considered, a product of a pattern area ratio and a stepwise height difference corresponds to a volume of the second layer (layer) which is to be processed by a CMP process in a mesh. That is, the product of the pattern area ratio $\alpha_0(i,j)$ and $h_S$ which is a difference in level or a stepwise height difference is equal to a total of a product of the pattern area ratio $\alpha_S(i,j)$ and the difference in level $h_S$ when it is assumed that no underlayer is present and a product of the pattern area ratio $\alpha_U(i,j)$ or the average pattern area ratio $\beta_U(i,j)$ of the underlayer and a difference in level (a stepwise height difference) $h_U$ of the underlayer. Therefore, the following equation (18-1) or (18-2) can be obtained.

$$h_S\cdot\alpha_0(i,j)=h_S\cdot\alpha_S(i,j)+h_U\cdot\alpha_U(i,j) \quad (18\text{-}1)$$

$$h_S\cdot\alpha_0(i,j)=h_S\cdot\alpha_S(i,j)+h_U\cdot\beta_U(i,j) \quad (18\text{-}2)$$

Therefore, the equations (18-1) and (18-2) are divided by $h_S$, to give the equations (2) and (3). In Example 6, in the above manner, a so-called pattern volume ratio is made uniform within a mask pattern. That is, the second layer (layer) can be uniformly flattened by providing dummy patterns to the meshes having small pattern volume ratios.

When the underlayer is composed of a plurality of layers (N layers), the equation (2) or (3) can be applied depending upon whether or not a CPM process is applied to each layer. That is, when the underlayer is composed of a first layer, a second layer, . . . an N-th layer, $\alpha_0(i,j)$ of each layer can be determined on the basis of the following equation (19-1), (19-2), (19-3) or (19-4) depending upon whether or not a CPM process is applied to the layers. In the equations (19-1) and (20-1), a subscript "n" is the number of a layer constituting the underlayer, and n=1, 2, . . . N−1. Further, $\alpha_{n+1\_s}(i,j)$ shows a pattern area ratio of an (n+1)-th underlayer in a mesh(i,j) when it is assumed that no underlayer is present, $h_{n+1\_s}$ is a difference in level or a stepwise height difference arising in an (n+1)-th underlayer after a pattern is formed in the (n+1)-th underlayer, $h_{n\_U}$ shows a difference in level or a stepwise height difference arising in an n-th underlayer, a pattern area ratio $\alpha_{n\_U}(i,j)$ shows a pattern area ratio in a mask used for forming a pattern in an n-th underlayer, and an average pattern area ratio $\beta_{n\_U}(i,j)$ is an average pattern area ratio in a mask used for forming a pattern in an n-th underlayer.

$$\alpha_{n+1}(i,j)=\alpha_{n+1\_s}(i,j)+(h_{n\_U}/h_{n+1\_s})\cdot\alpha_{n\_U}(i,j) \quad (19\text{-}1)$$

$$\alpha_0(i,j)=\alpha_S(i,j)+(h_{N\_U}/h_S)\cdot\alpha_{N\_U}(i,j) \quad (19\text{-}2)$$

$$\alpha_{n+1}(i,j)=\alpha_{n+1\_s}(i,j)+(h_{n\_U}/h_{n+1\_s})\cdot\beta_{n\_U}(i,j) \quad (20\text{-}1)$$

$$\alpha_0(i,j)=\alpha_S(i,j)+(h_{N\_U}/h_S)\cdot\beta_{N\_U}(i,j) \quad (20\text{-}2)$$

Figure 7A:
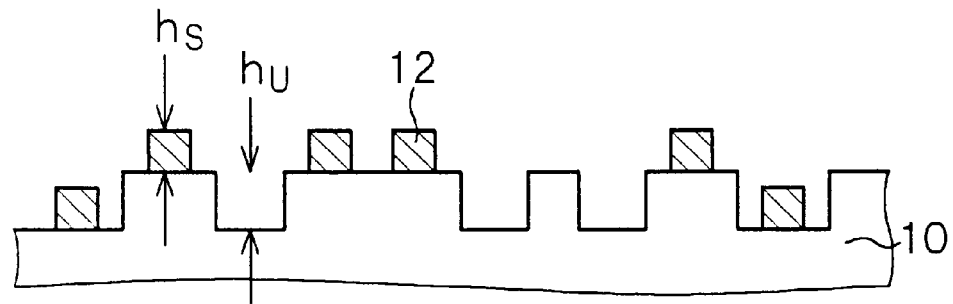
FIGS. 7A to 7C are schematic partial cross-sectional views of an underlayer, etc., for explaining the method of designing a mask pattern in Example 6.
Figure 7B:
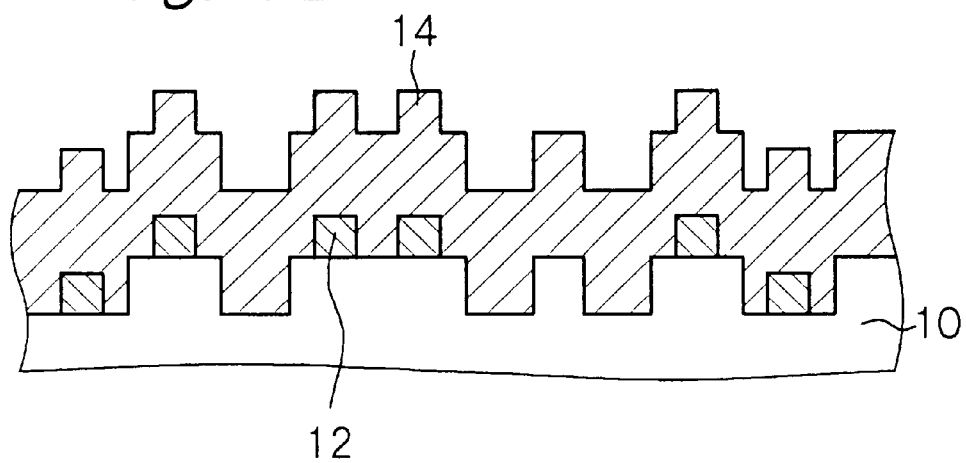
Figure 7C:
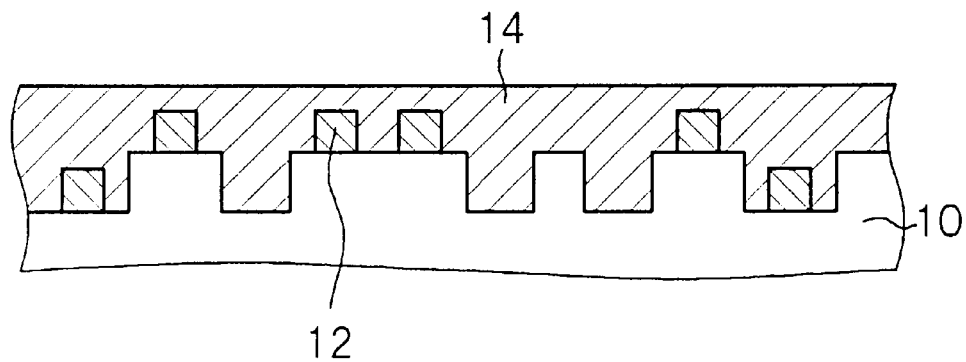

As shown in the schematic partial cross-sectional views of FIGS. 7A to 7C, the method of manufacturing an integrated circuit in which a mask produced on the basis of Example 6 is used for forming a pattern in a first layer or a substrate, can be the same as the method in Example 2 or 3, and the detailed explanation thereof is therefore omitted.

EXAMPLE 7

Example 7 is directed to the method of designing a mask pattern to be formed in a mask for use with a lithography process according to the fourth, fifth or sixth aspect of the present invention. That is, Example 7 is concerned with a method of designing a mask pattern to be formed in a mask used for manufacturing an integrated circuit (4) by forming a pattern in a first layer deposited on a substrate, on the basis of lithography to which said mask is applied, then depositing a second layer on the substrate including the patterned first layer and flattening the second layer by a chemical/mechanical polishing process, or (5) by forming a pattern in a substrate, on the basis of lithography to which said mask is applied, then depositing a layer on the substrate and flattening the layer by a chemical/mechanical polishing process, or (6) by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process.

In Example 7, each mesh having the form of a lattice has a predetermined size of 100 $\mu$m×100 $\mu$m. Further, average pattern area ratios $\beta(i,j)$ were determined on the basis of the following equations (1-1) and (1-2). In the equation (1-1), 10 was used as a value of m, and 9 was used as a value of Q. That is, a predetermined region of a mask pattern including a mesh(i,j) as the central point has a size of 2100 $\mu$m×2100 $\mu$m. In other words, an average pattern area ration $\beta(i,j)$ is determined as an average of pattern area ratios within a 2100 $\mu$m×2100 $\mu$m region including the mesh(i,j) as the central point. Further, the value of $\alpha_{q+1}(i,j)$ was smoothed (averaged) 10 times. Generally, since a plurality of chips are produced on one wafer with the mask, when a position of a mesh (i+l,j+k) in the equation (1-1) deviates from the mask pattern of one chip, a corresponding pattern area ratio $\alpha_0$ in the region of a mask pattern of one adjacent chip may be used.

$$\alpha_{q+1}(i,j) = \sum_{l=-m}^{l=m}\sum_{k=-m}^{k=m} \alpha_q(i+l, j+k)/(2m+1)^2 \quad (1\text{-}1)$$

$$\beta(i,j) = \alpha_{Q+1}(i,j) \quad (1\text{-}2)$$

wherein q=0, 1, 2, . . . , Q.

Figure 8A:
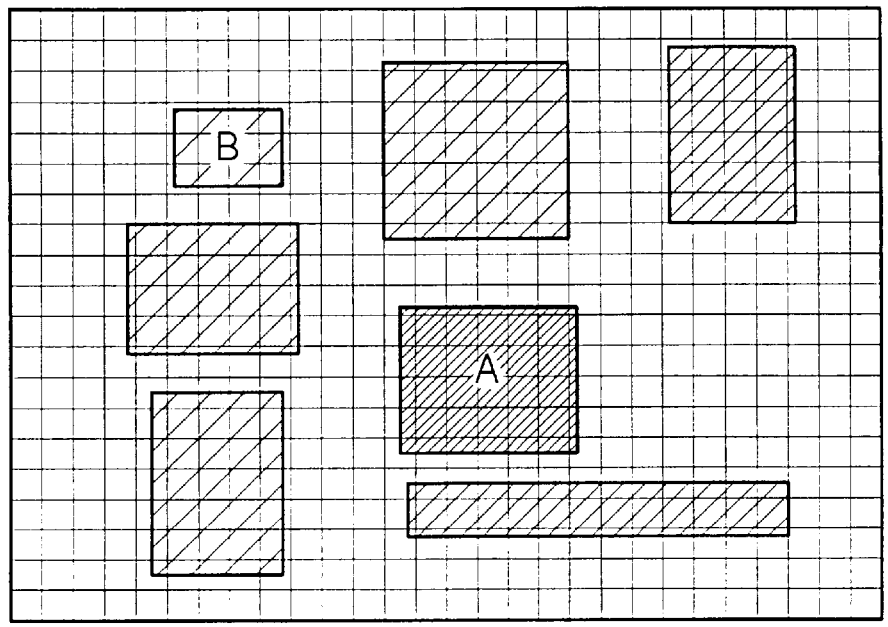
FIGS. 8A and 8B are schematic plan views of a mask pattern for explaining the method of designing a mask pattern in Example 7.
Figure 8B:
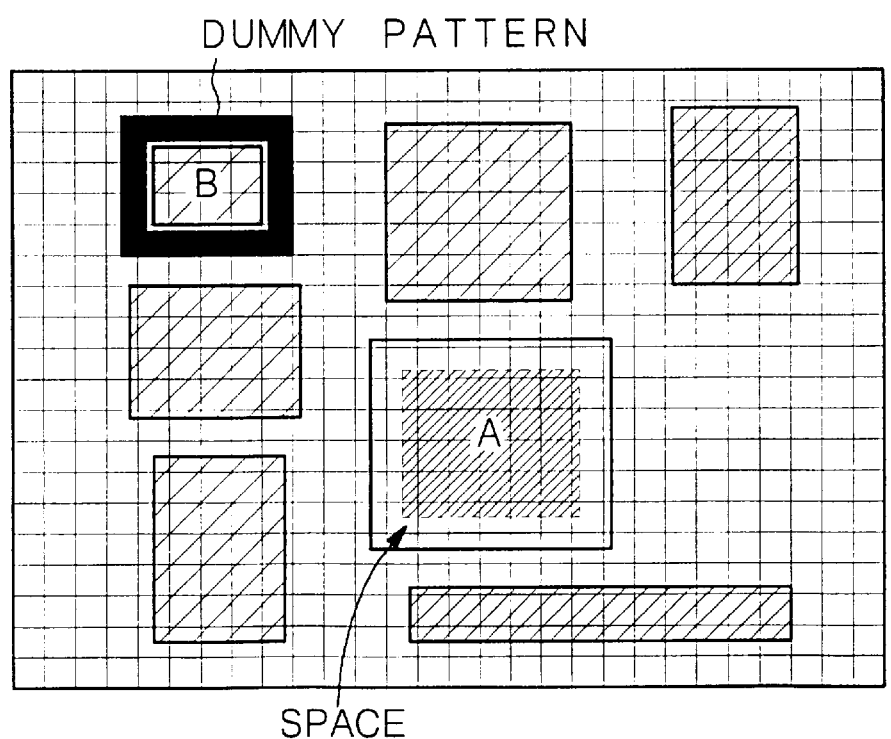
Figure 9:
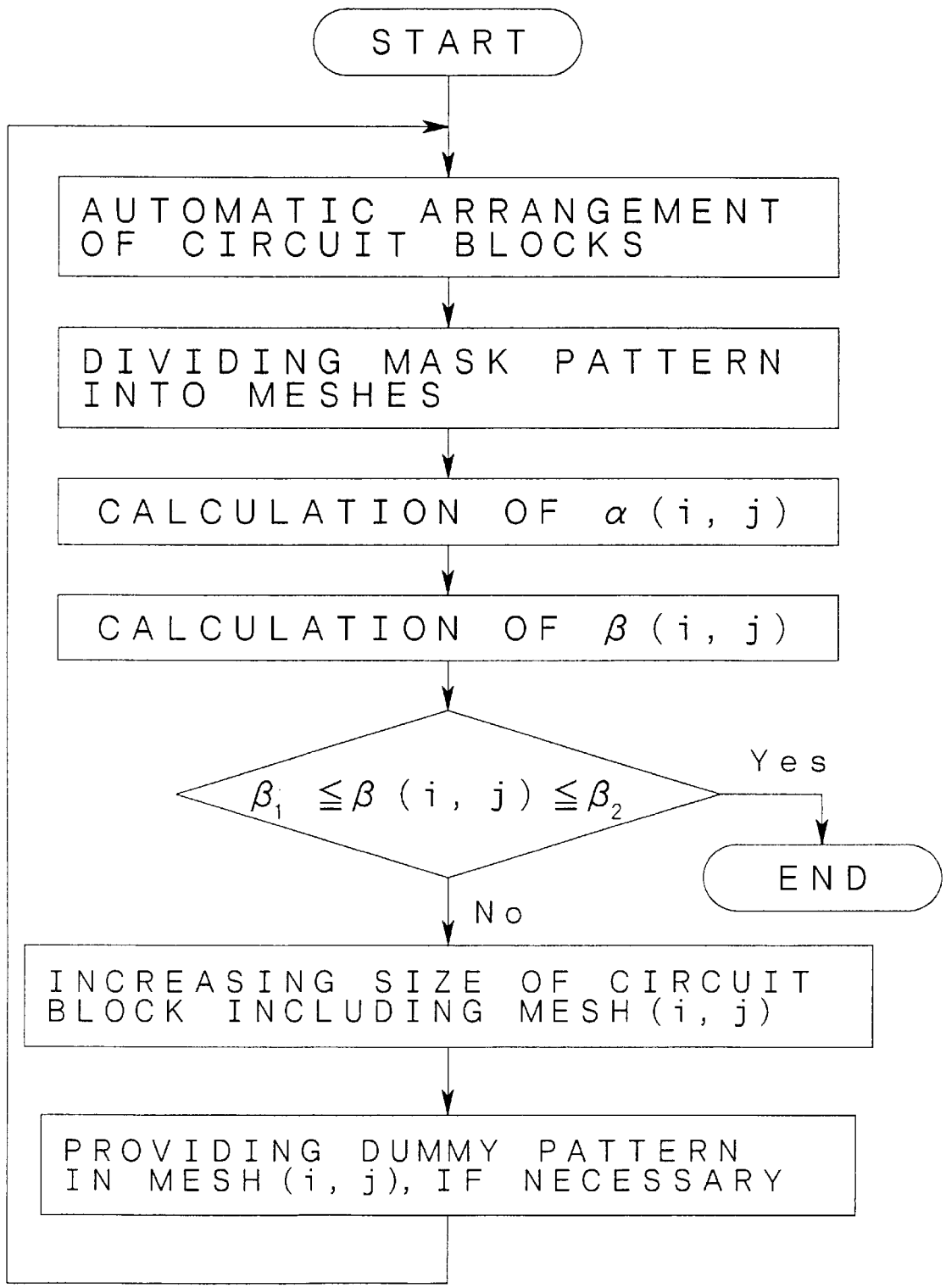
FIG. 9 is a flow chart of the method of designing a mask pattern in Example 7.

FIG. 9 shows the flow chart of steps of the method of designing a mask pattern in Example 7. In Example 7, the circuit blocks designed in advance are first automatically arranged on the basis of a known algorithm such that a chip area is minimized. That is, the area of one chip is minimized by arrange circuit block-circuit block distances to be as small as possible. FIG. 8A schematically shows the so-obtained arrangement of the circuit blocks. In this state, there are included circuit blocks having a larger number of patterns and circuit blocks having a smaller number of patterns. When a mask pattern for obtaining the above patterns is divided into meshes having the form of a lattice and having a size of 100 $\mu$m×100 $\mu$m each and pattern area ratios $\alpha_0(i,j)$ are determined one by one with regard to the meshes(i,j), the pattern area ratios $\alpha_0(i,j)$ are greatly fluctuate. In FIGS. 8A and 8B, rectangular regions surrounded by thick lines show the circuit blocks, and the circuit blocks having higher pattern area ratios are indicated by hatching more densely. Further, squares formed by vertical lines and horizontal lines indicate meshes. Any pattern of the mask pattern belongs to one of a plurality of the circuit blocks except for patterns connecting one circuit block to another circuit block.

Average pattern area ratios $\beta(i,j)$ are determined on the basis of the equations (1-1) and (1-2). And, patterns of the mask pattern are rearranged so as to decrease the fluctuation of the average pattern area ratios $\beta(i,j)$. In Example 7, the rearrangement of the patterns includes the increasing of size of the circuit blocks.

Specifically, it is evaluated whether or not all the obtained average pattern area ratios $\beta(i,j)$ are within a predetermined range ($\beta_1$~$\beta_2$). That is, it is evaluated whether all the average pattern area ratios $\beta(i,j)$ satisfy $\beta_1 \leq \beta(i,j) \leq \beta_2$. When there is an average pattern area ratio $\beta(i,j)$ which does not satisfy $\beta_1 \leq \beta(i,j) \leq \beta_2$, a circuit block including a maximum value of the average pattern area ratios $\beta(i,j)$ (circuit block A in FIGS. 8A and 8B) and a circuit block containing a minimum value (circuit block B in FIGS. 8A and 8B) are selected. And, these circuit blocks A and B are increased in size. That is, the external dimensions of the circuit blocks A and B are increased. The unit of an increment of the size of the circuit blocks was arranged to be 1/an integer times (1/10, 10 $\mu$m) as large as the size of the mesh. As a result, the external forms of the circuit blocks A and B increase in size by 20 $\mu$m. In the circuit block A, this region which is an increment is a space. That is, no pattern is provided in the region which is an increment. On the other hand, in the circuit block B, a dummy pattern is provided in the region which is an increment. This state is shown in FIG. 8B. In that region of the circuit block A which indicated by slanting lines, a pattern is formed. In FIG. 8B, the dummy pattern is blackened. When a mesh having a smallest average pattern area ratio $\beta(i,j)$ does not belong to a circuit block, a dummy pattern is provided in the entire area of the mesh(i,j) if possible.

Then, the circuit blocks are automatically arranged again according to a known algorithm, and the pattern area ratios $\alpha_0(i,j)$ are determined. Further, the average pattern area ratios $\beta(i,j)$ are determined on the basis of the equations (1-1) and (1-2). And, it is evaluated whether or not all the obtained average pattern area ratios β(i,j) are within a predetermined range ($\beta_1 \sim \beta_2$). When all the average pattern area ratio β(i,j) satisfy $\beta_1 \leq \beta(i,j) \leq \beta_2$, the mask pattern designing is finished. On the other hand, when there is any average pattern area ratio β(i,j) which does not satisfy $\beta_1 \leq \beta(i,j) \leq \beta_2$, the procedures of selecting a circuit block including a maximum value of the average pattern area ratios β(i,j) and a circuit block including a minimum value thereof are repeated.

The above-designed mask pattern can be used to produce a mask according to a known method. When a mask produced by the above designing method is used to form a pattern in a first layer (or substrate or starting substrate), the fluctuation of pattern area ratios α' of the pattern formed in the first layer (or substrate or starting substrate) decreases when a chip is taken as a whole. Therefore, after a second layer (layer) is deposited on the entire surface, or after two substrates are bonded, and when the second layer (or layer or starting substrate) is flattened by a CMP process for manufacturing an integrated circuit, the flattening treatment of the second layer (or layer or starting substrate) can be uniformly and reliably carried out.

According to the method of designing a mask pattern explained in Example 7, there can be obtained a mask pattern of which the fluctuation of the average pattern area ratios β(i,j) are finally almost 0. Therefore, the flattening treatment of the second layer (or layer or starting substrate) can be more uniformly and more reliably carried out than in the method of designing a mask pattern explained in Example 1. However, the circuit blocks increase in size, and as a result, the chip increases in size. It is therefore required to determine how many times the circuit blocks are rearranged in view of trade-off of an ideal chip size and the fluctuation of the average pattern area ratios β(i,j). When the method of designing a mask pattern explained in Example 7 is applied to the method of designing a mask pattern according to the fourth aspect of the present invention or the method of manufacturing an integrated circuit according to the fourth aspect of the present invention, it can be applied only to a case where the first layer is positioned as the lowest layer. The reason therefor is that since circuit blocks are rearranged, if the first layer is not positioned as the lowest layer, the positional relationship between the circuit blocks in the first layer and the circuit blocks in a lower layer strains.

The method of manufacturing an integrated circuit in which a mask produced on the basis of Example 7 is used for forming a pattern in a first layer or a substrate, can be the same as the method in Examples 2 to 4, and the detailed explanation thereof is therefore omitted. Further, the method of manufacturing an integrated circuit on the basis of an SOI technology in which a mask produced on the basis of Example 7 is used to form a pattern in a substrate can be the same as the method in Example 5, and the detailed explanation thereof is therefore omitted. Further, the method of designing a mask pattern or the method of manufacturing an integrated circuit, explained in Example 6, can be applied to the method of designing a mask pattern or the method of manufacturing an integrated circuit in Example 7.

EXAMPLE 8

As explained already, when the flattening process of the second layer (layer) is three-dimensionally considered, a product of a pattern area ratio and a stepwise height difference corresponds to a volume of the second layer (layer) which is to be processed by a CMP process in a mesh. When the second layer (layer) is deposited on the first layer (substrate), and it is assumed that the second layer (layer) is deposited in a perpendicular direction alone, the second layer (layer) that can be obtained has a cross-sectional form as shown in a schematic cross-sectional view of FIG. 12. However, when the second layer (layer) is formed by a CVD method, the cross-sectional form of the projected portion of the second layer (layer) in a perpendicular direction, which portion is deposited on a pattern formed in the first layer (substrate), differs depending upon which CVD method is employed, a conformal CVD method in which the deposition is based on a surface reaction or a high-density plasma CVD method.

That is, when the second layer (layer) is deposited by a conformal CVD method, the deposition takes place all over the surface of the first layer (substrate), and the projected portion of the second layer (layer) deposited on the pattern formed in the first layer (substrate) has a width W which is, for example, approximately 2 to 2.6 times as large as the width $W_0$ of the pattern formed in the first layer (substrate). The above projected portion of the second layer (layer) deposited on the pattern formed in the first layer (substrate) has side walls which are nearly perpendicular. The term "nearly perpendicular" includes a case where the side walls are not completely perpendicular. This state is shown in a schematic partial cross-sectional view of FIG. 13. On the other hand, when the second layer (layer) is deposited by a high-density plasma CVD method, generally, the deposition of the second layer (layer) and the sputter-etching proceed concurrently, and a planing rate of the surface of the second layer (layer) by means of a bias applied to plasma particles and a deposition rate of the second layer (layer) are balanced. As the deposition of the second layer (layer) proceeds, side walls of the projected portion of the second layer formed on the pattern formed in the first layer (substrate) is planed away thinner. The width of the projected portion of the second layer (layer) is therefore smaller than the width $W_0$ of the pattern formed in the first layer (substrate). This state is shown in a schematic cross-sectional view of FIG. 14. Therefore, in any CVD method, the apparent value of the pattern area ratio $\alpha_0(i,j)$ of each mesh(i,j) changes.

In the method of designing a mask pattern according to the first, second, fourth or fifth aspect of the present invention, or in the method of manufacturing an integrated circuit according to the first, second, fourth or fifth aspect of the present invention, it is preferred to compensate the pattern area ratio $\alpha_0(i,j)$ of each mesh(i,j) on the basis of a pattern area increase ratio I determined by the thickness of the second layer (layer) to be deposited on the entire surface or on the basis of a pattern area increase ratio I determined by the thickness of the pattern to be formed in the first layer (substrate) and the thickness of the second layer (layer) to be deposited on the entire surface.

In Example 8, the pattern area ratio $\alpha_0(i,j)$ of each mesh(i,j) is compensated on the basis of a pattern area increase ratio I determined by the thickness of the second layer deposited on the entire surface. When the projected portion of the second layer deposited on the patterned first layer has a circumferential length of L and when a pattern area increase amount determined by the thickness of the second layer (layer) deposited on the entire surface or a pattern area increase amount determined by the thickness of the pattern formed in the first layer (substrate) and the thickness of the second layer (layer) deposited on the entire surface is ΔS, ΔS can be expressed as ΔS=I×L. The pattern area ratio $\alpha_0(i,j)$ of the mesh(i,j) is compensated on the basis of the above pattern area increase amount ΔS.

Figure 13:
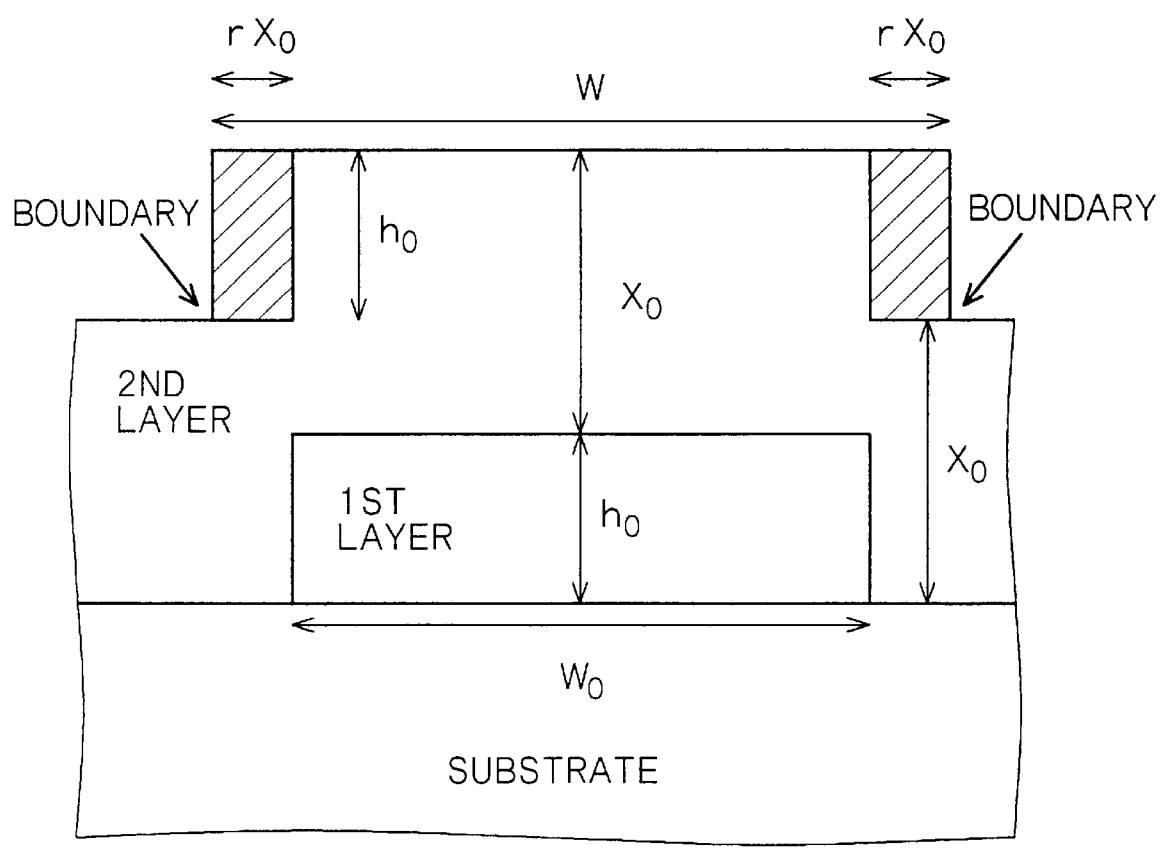
FIG. 13 is a schematic partial cross-sectional view of a second layer, etc., when the second layer is formed by a CVD method in which the deposition is based on a surface reaction.

In Example 8, the deposition of the second layer by a conformal CVD method in which the deposition is based on a surface reaction is taken up as an example for explanations below. When the second layer is deposited by the above CVD method, the cross-sectional form in a perpendicular direction is conformal, and a cross-sectional form as schematically shown in FIG. 13 is obtained. Since the product of a compensated pattern area ratio and a stepwise height difference corresponds to a volume to be processed by a CMP process, the volume is calculated first. Meanwhile, when the second layer is deposited by a conformal CVD method, the width W of the projected portion of the second layer is larger than the width $W_0$ of the pattern formed in the first layer. In FIG. 13, expanded regions of the second layer are indicated by slanting lines. The relationship between W and $W_0$ is represented by the following equation (21), $$(W - W_0)/2 = X_0 \times (r_H/r_V) \tag{21}$$

wherein $X_0$ is a thickness of the second layer, $r_H$ is a deposition rate of the second layer in a horizontal direction and $r_V$ is a deposition rate of the second layer in a perpendicular direction. Further, the volume V is represented by the following equation (22), $$V = (W_0 + 2X_0 \times r) \times h_0 \times L_P \tag{22}$$

wherein $L_P$ is a length of a pattern. "$r_H/r_V$" is sometimes abbreviated as "r".

Figure 12:
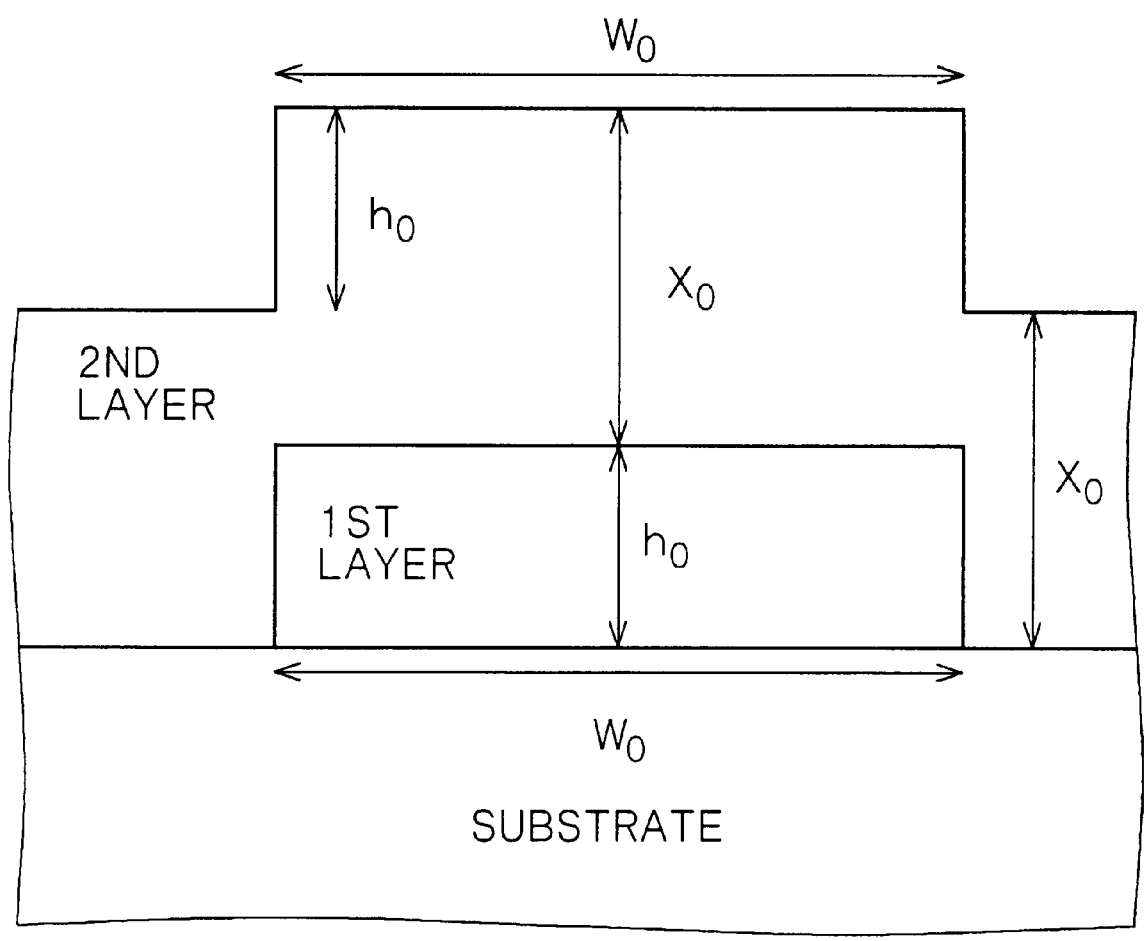
FIG. 12 is a schematic partial cross-sectional view of a second layer, etc., which is assumed to be deposited in a perpendicular direction alone.

In the second layer having a cross-sectional form shown in the schematic cross-sectional view of FIG. 12, the volume $V_0$ to be processed by a CMP process is represented by the following equation (23), $$V_0 = W_0 \times h_0 \times L_P \tag{23}$$

wherein $h_0$ is a thickness of the pattern formed in the first layer.

Therefore, the value of $\Delta V$ (=$V - V_0$) is as shown in the following equation (24).

$$\Delta V = 2X_0 \times r \times h_0 \times L_P \tag{24}$$

The length $L_P$ of the pattern and the circumferential length L of the projected portion of the second layer deposited on the pattern formed in the first layer can be approximated in the following relationship. In FIG. 13, boundary lines defining the circumferential length L of the projected portion of the second layer is indicated by arrows.

$$L_P \approx L/2$$

Therefore, when the equation (24) is expressed by using the circumferential length L, it can be expressed as shown in the following equation (25). Owing to the relationship of $\Delta S = I \times L$, further, the pattern area increase ratio I can be determined on the basis of the equation (4).

$$\Delta V = X_0 \times r \times h_0 \times L \tag{25}$$

$$\Delta S = \Delta V / h_0 \tag{26}$$
$$= I \times L$$
$$= X_0 \times (r_H / r_V) \times L$$

$$I = X_0 \times (r_H / r_V) \tag{4}$$

Meanwhile, the deposition rate $r_H$ of the second layer in a horizontal direction and the deposition rate $r_V$ of the second layer in a perpendicular direction can be determined on the basis of various experiments. Further, the thickness $X_0$ of the second layer is a known value. Therefore, the value of I in the equation (4) can be calculated. Further, the circumferential length L of the projected portion of the second layer deposited on the pattern formed in the first layer can be easily obtained on the basis of a design value of the pattern to be formed in the first layer, and the like. On the basis of $\Delta S = I \times L$, therefore, $\Delta S$ for each pattern can be calculated, and on the basis of the pattern area increase amount $\Delta S$, the pattern area ratio $\alpha_0(i,j)$ of each mesh(i,j) can be compensated. For example, when $(r_H/r_V)=0.5$, and $X_0=1.2$ μm, the value of I is +0.6 μm.

EXAMPLE 9

Example 9 is a variant of Example 8. In Example 9, a pattern area ratio $\alpha_0(i,j)$ of each mesh(i,j) is compensated on the basis of the pattern area increase ratio I defined by the thickness of a pattern formed in the first layer and the thickness of the second layer deposited on the entire surface. In Example 9, the deposition of the second layer by a high-density plasma CVD method is taken up as an example for explanations below. When the second layer is deposited by the high-density plasma CVD method, the side walls of the projected portion of the second layer formed on the pattern formed in the first layer is planed away thinner as the deposition of the second layer proceeds. As a result, each side wall of the projected portion of the second layer tilts at an angle of θ from a horizontal direction (see FIG. 14).

Figure 14:
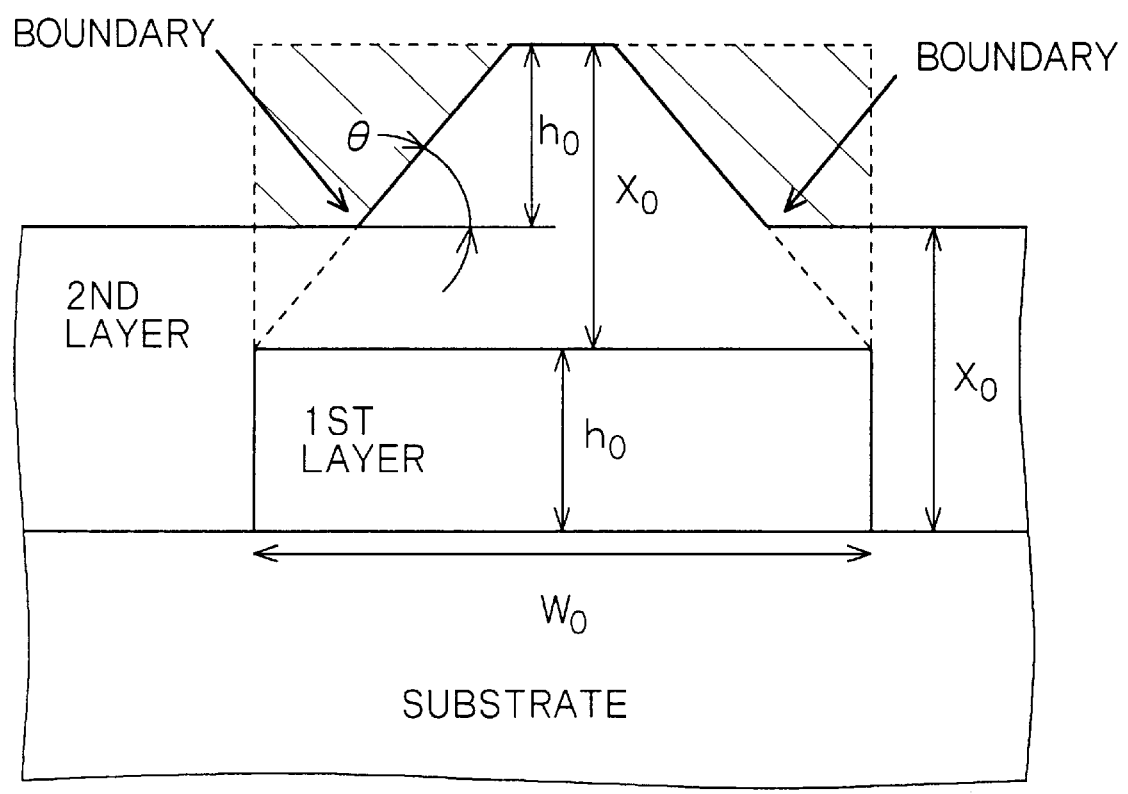
FIG. 14 is a schematic partial cross-sectional view of a second layer, etc., when the second layer is formed by a high-density plasma CVD method.

Meanwhile, since a product of a compensated pattern area ratio and a stepwise height difference corresponds to a volume of the second layer to be processed by a CMP process in a mesh, the above volume V is first calculated. In FIG. 14, regions indicated by slanting lines correspond to side wall portions which are planed off in the projected portion of the second layer. The resultant trapezoid has a top side length of ($X_0 \cot \theta$) and a bottom side length of $\{(X_0 - h_0) \cot \theta\}$. Therefore, the volume V and $\Delta V$ (=$V - V_0$) are as shown in the following equations (27) and (28). In the equation (28), the relationship of $L_P \approx L/2$ is incorporated. Further, $V_0$ is equal to $W_0 \times h_0 \times L_P$.

$$V = V_0 - 2\{(2X_0 - h_0)\cot\theta \times h_0 / 2 \times L_P\} \tag{27}$$

$$\Delta V = V - V_0 \tag{28}$$
$$= (h_0 - 2X_0)\cot\theta \times h_0 \times L / 2$$

Therefore, the pattern area increase amount $\Delta S$ can be obtained on the basis of the equation (29). Further, owing to the relationship of $\Delta S = I \times L$, the pattern area increase ratio I can be calculated on the basis of the equation (5).

$$\Delta S = \Delta V / h_0 \tag{29}$$
$$= (h_0 - 2X_0)\cot\theta \times L / 2$$

$$I = (h_0 - 2X_0)\cot\theta / 2 \tag{5}$$

Meanwhile, the angle θ can be determined on the basis of various experiments, and the thickness $h_0$ of the pattern to be formed in the first layer and the thickness $X_0$ of the second layer are known values. Therefore, the value of I in the equation (5) can be determined. Further, the circumferential length L of the projected portion of the second layer deposited on the pattern formed in the first layer can be easily obtained on the basis of design value of the pattern to be formed in the first layer, and the like. Therefore, $\Delta S$ for each pattern can be obtained on the basis of the relationship of ΔS=I×L, and on the basis of the pattern area increase amount ΔS, the pattern area ratio $\alpha_0(i,j)$ of each mesh(i,j) can be compensated. For example, when θ=30 degrees, $X_0$=0.8 μm and $h_0$=0.7 μm, the value of I is −0.78 μm.

EXAMPLE 10

Figure 15:
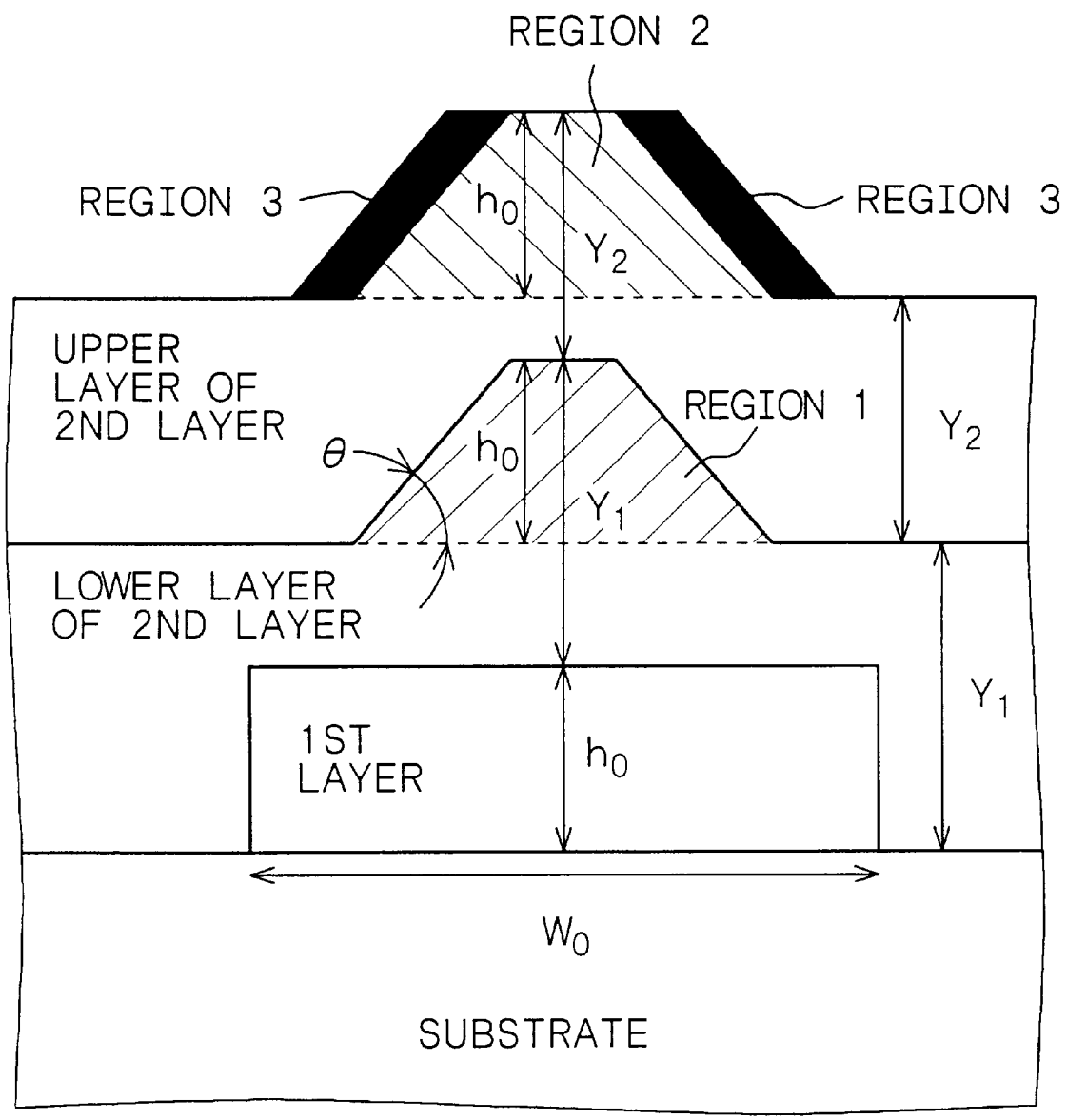
FIG. 15 is a schematic partial cross-sectional view of a second layer, etc., when a lower layer of a second layer is formed by a high-density plasma CVD method and an upper layer of the second layer is formed by a CVD method in which the deposition is based on a surface reaction.

Example 10 is a combination of Examples 8 and 9. In Example 10, the pattern area ratio $\alpha_0(i,j)$ of each mesh(i,j) is compensated on the basis of the pattern area increase ratio I defined by the thickness of the pattern formed in the first layer and the thickness of the second layer deposited on the entire surface. In Example 10, the second layer has a two-layer structure composed of a lower layer and an upper layer. The lower layer is deposited by a conformal CVD method in which the deposition is based on a surface reaction, and the upper layer is deposited by a high-density plasma CVD method. In this case, the side walls of the lower layer portion of the projected portion of the second layer formed on the pattern formed in the first layer tilt at an angle of θ from a horizontal direction, and the surface of the upper layer portion of the second layer formed on the side walls of the lower layer of the second layer tilts at an angle of θ from a horizontal direction. This state is shown in a schematic partial cross-sectional view of FIG. 15. The thickness of the pattern formed in the first layer is $h_0$, the thickness of the lower layer of the second layer is $Y_1$, the thickness of the upper layer of the second layer is $Y_2$, the deposition rate of the upper layer of the second layer in a horizontal direction is $r_{2H}$ and the deposition rate of the portion of the upper layer in a normal direction is $r_{2V}$. Meanwhile, when the upper layer of the second layer is deposited by a conformal CVD method in which the deposition is based on a surface reaction, the upper layer of the projected portion of the second layer has a greater width than it is simply deposited in a perpendicular direction. In FIG. 15, that region of the upper layer which has a greater width (region 3) is blackened.

In FIG. 15, a region 1 indicated by slanting lines and a region 2 indicated by slanting lines have the same cross-sectional forms, and the area $SS_1$ of the region 1 and the area $SS_2$ of the region 2 equal each other and can be determined on the basis of the following equation (30).

$$SS_1 = SS_2 \quad (30)$$
$$= W_0 \times h_0 - 2(2Y_1 - h_0)\cot\theta \times h_0/2$$

On the other hand, regions 3 which are blackened are parallelogramatic, and its bottom side has a length of $h_0/\sin\theta$. The above parallelogram has a height of $\{(r_{2H}/r_{2V})Y_2 - Y_2 \cos\theta\}$. Therefore, the area $SS_3$ of the region 3 can be calculated on the basis of the equation (31). Further, the total area of the region 2 and the regions 3 has a relationship as shown in the equation (32).

$$SS_3 = 2h_0 \times Y_2\{(r_{2H}/r_{2V}) - \cos\theta\}/\sin\theta \quad (31)$$
$$SS = SS_2 + SS_3 \quad (32)$$
$$= W_0 \times h_0 + 2(h_0 - 2Y_1)\cot\theta \times h_0/2 +$$
$$2h_0 \times Y_2\{(r_{2H}/r_{2V}) - \cos\theta\}/\sin\theta$$

The volume V corresponding to the region 2 and the regions 3 equals the product of the total area SS and $L_P$. Further, $V_0$ equals $W_0 \times h_0 \times L_P$. Therefore, $\Delta V(=V-V_0)$ is as shown below.

$$\Delta V = V - V_0 \quad (33)$$
$$= SS \times L_P - W_0 \times h_0 \times L_P$$
$$\approx (L/2)[(h_0 - 2Y_1)\cot\theta \times h_0 +$$
$$2h_0 \times Y_2\{(r_{2H}/r_{2V})(-\cos\theta)/\sin\theta]$$

Meanwhile, owing to the relationship of $\Delta S = \Delta V/h_0$, ΔS can be calculated on the basis of the equation (33), and further, since ΔS=I×L, I can be calculated.

$$\Delta S=(L/2)[(h_0-2Y_1)\cot\theta+2Y_2\{(r_{2H}/r_{2V})-\cos\theta\}/\sin\theta] \quad (34)$$
$$I=(h_0-2Y_1)\cot\theta/2+Y_2\{(r_{2H}/r_{2V})-\cos\theta\}/\sin\theta \quad (6)$$

The angle θ, $r_{2H}$, and $r_{2V}$ can be determined by various experiments, and the thickness of $h_0$ of the pattern to be formed in the first layer, the thickness of the second layer $Y_1$ and $Y_2$ are known values. Therefore, I in the equation (6) can be determined. Further, the circumferential length L of the projected portion of the second layer deposited on the pattern formed in the first layer can be obtained on the basis of the design value of the pattern, and the like. Therefore, owing to the relationship of ΔS=I×L, ΔS for each pattern can be determined, and on the basis of the pattern area increase amount ΔS, the pattern area ratio $\alpha_0(i,j)$ of each mesh(i,j) can be compensated.

Figure 16A:
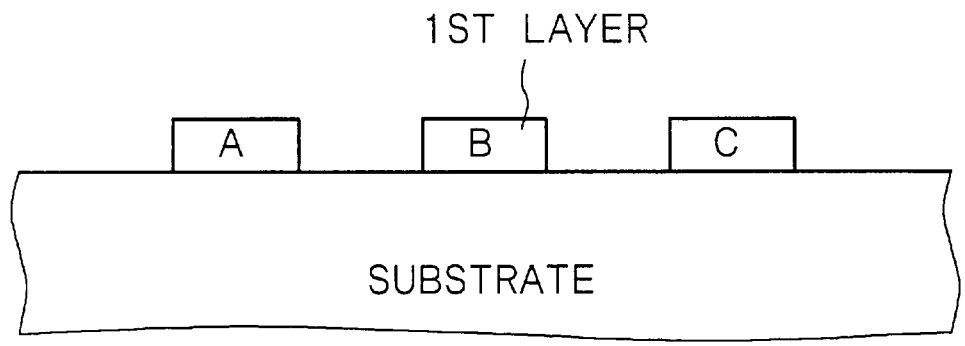
FIGS. 16A to 16C are schematic partial cross-sectional views of a pattern formed in a first layer.
Figure 16B:
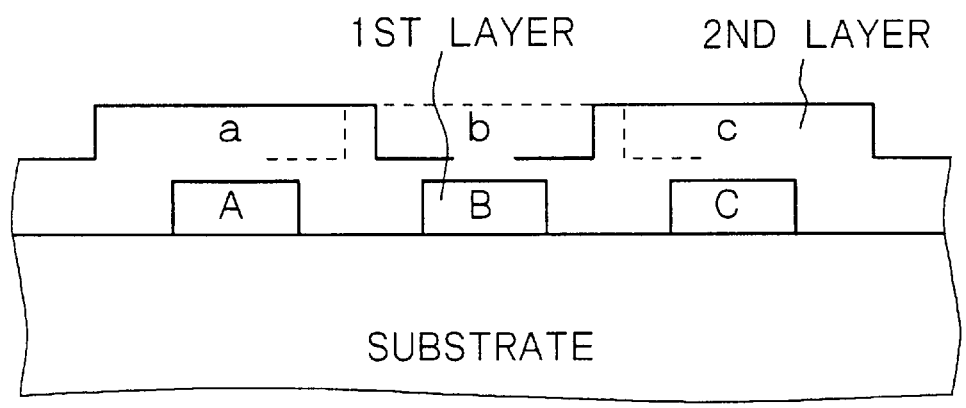
Figure 16C:
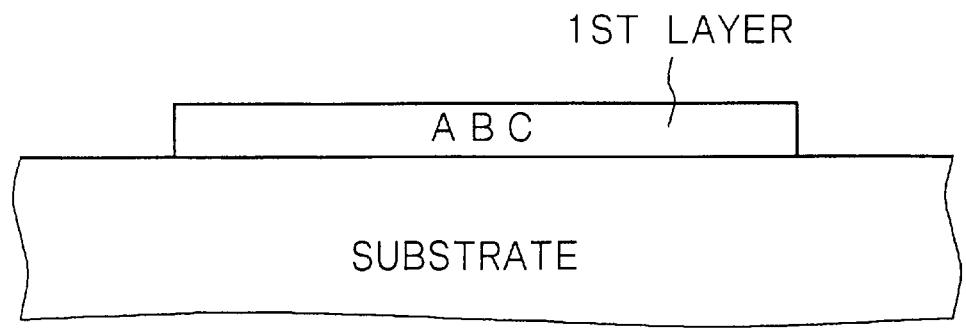
Figure 17A:
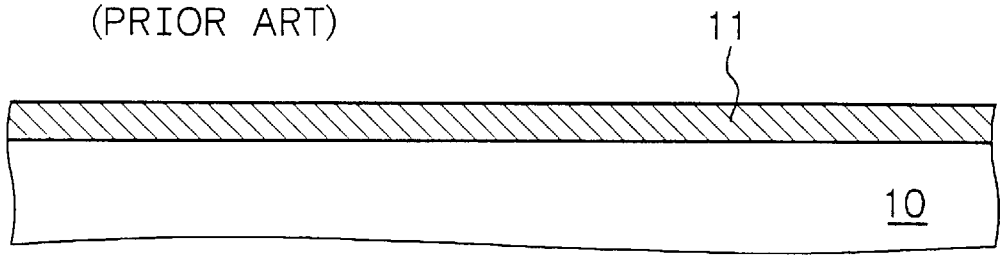
FIGS. 17A to 17D are schematic partial cross-sectional views of a first layer, etc., for explaining a conventional chemical/mechanical polishing process.
Figure 17B:
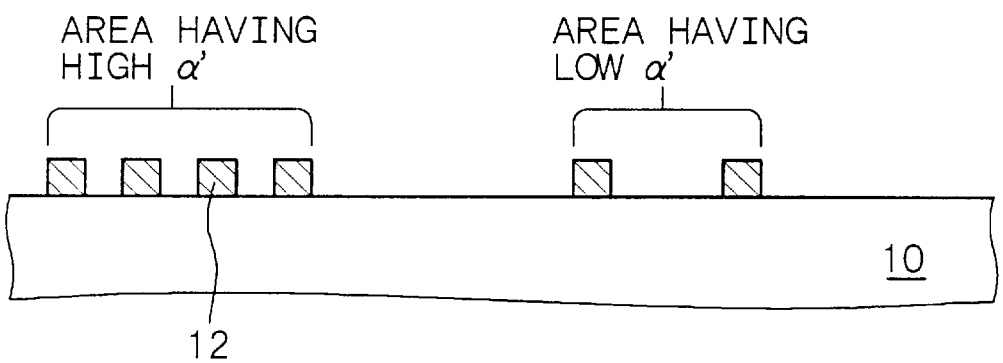
Figure 17C:
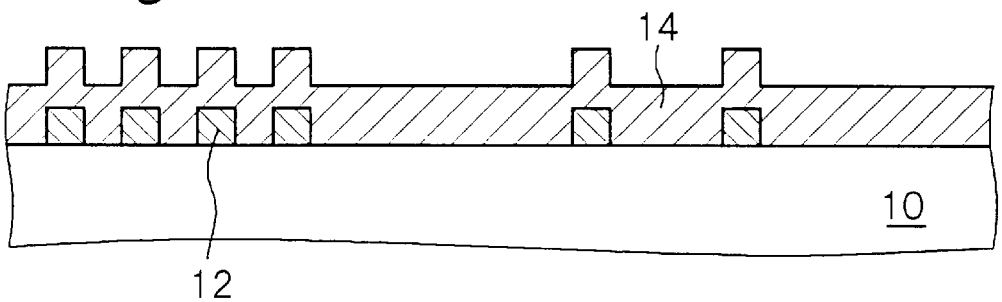
Figure 17D:
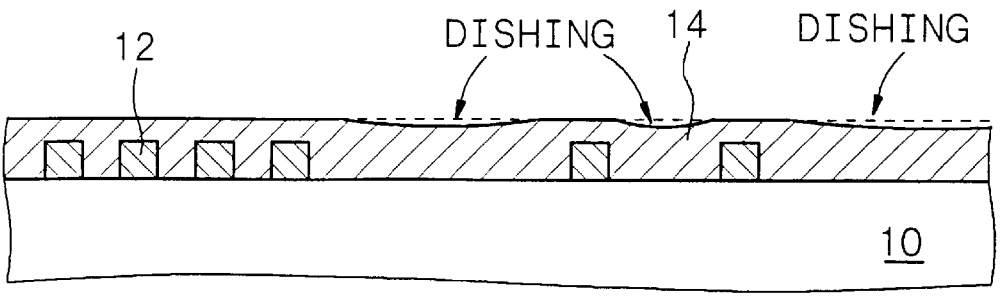
Figure 18A:
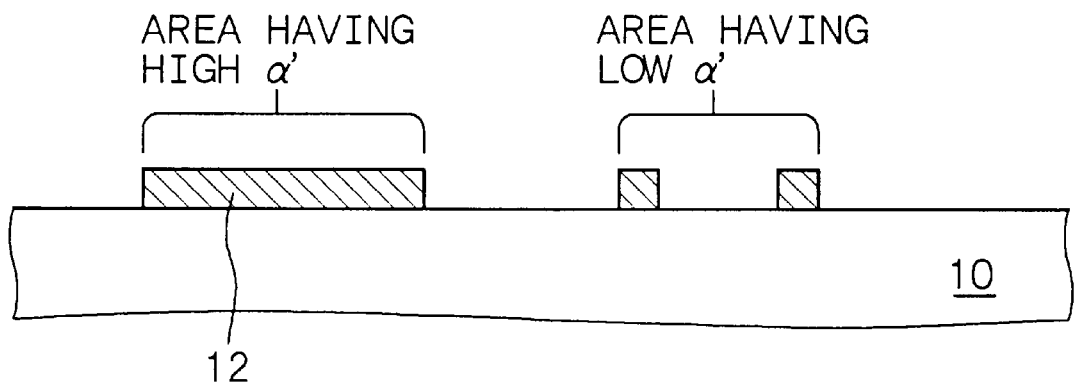
FIGS. 18A to 18C are schematic partial cross-sectional views of a first layer, etc., for explaining a conventional chemical/mechanical polishing process different from that in FIGS. 17A to 17D.
Figure 18B:
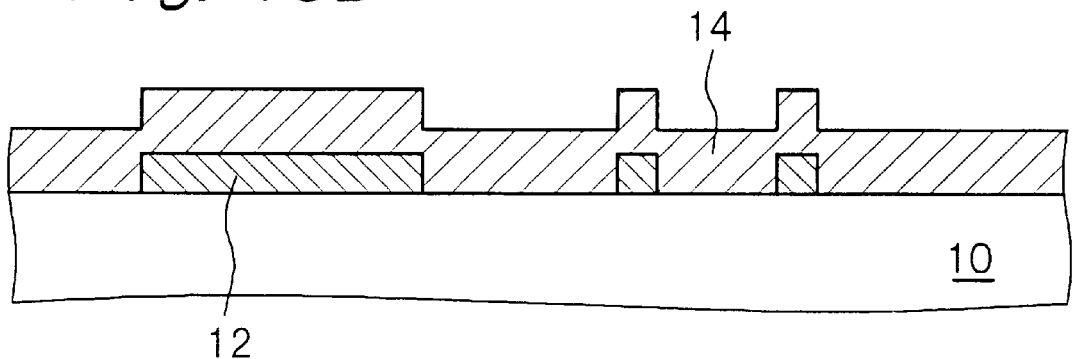
Figure 18C:
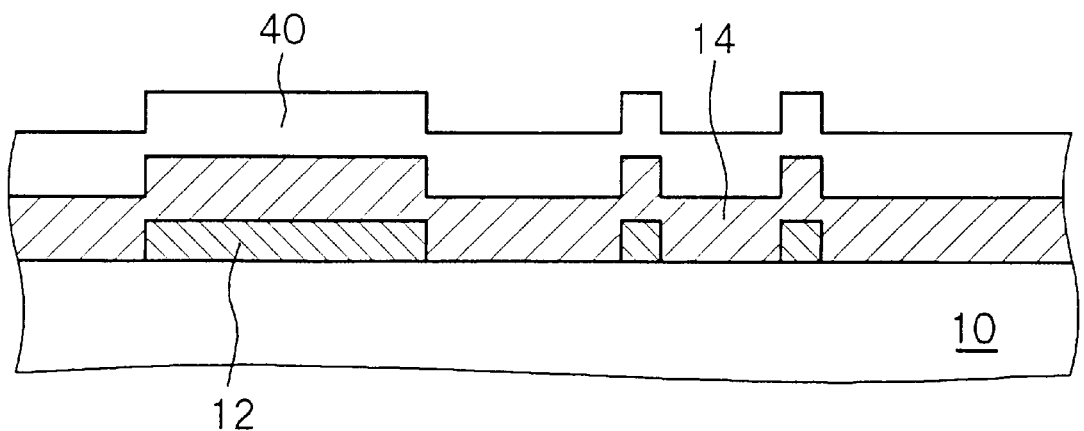
Figure 19A:
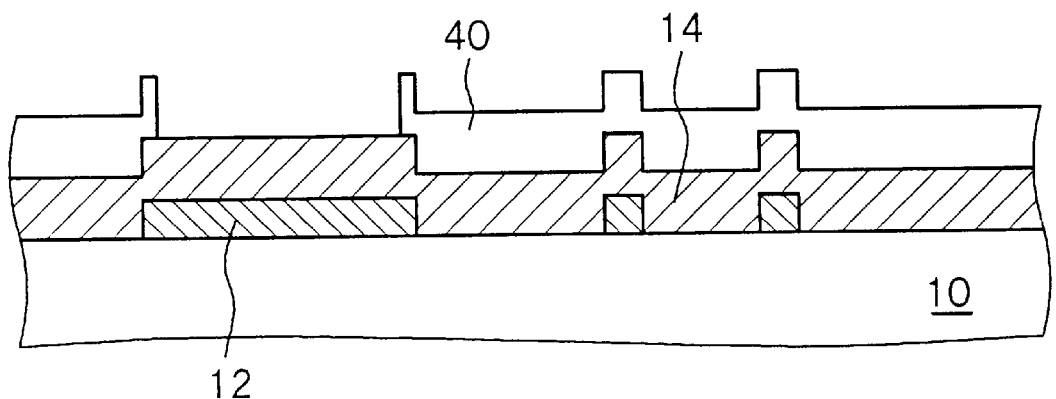
FIGS. 19A and 19B, subsequent to FIG. 18C, show are schematic partial cross-sectional views of a first layer, etc., for explaining the conventional chemical/mechanical polishing.
Figure 19B:
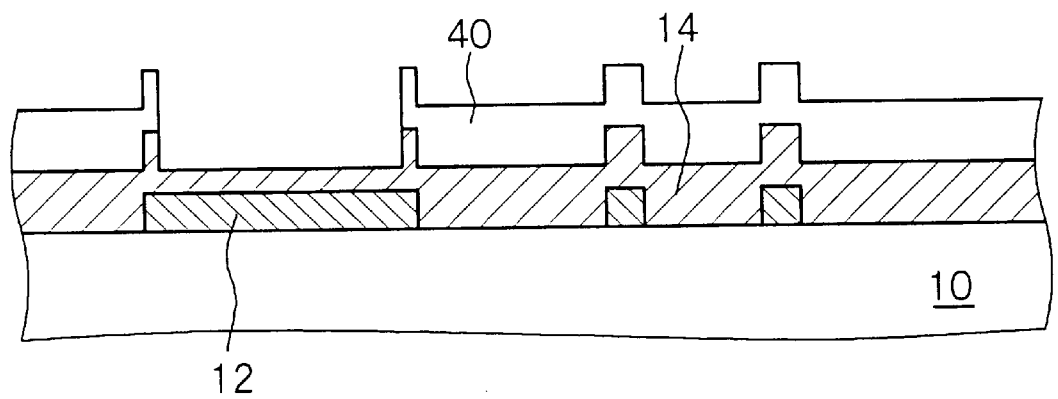

When the pattern area ratio $\alpha_0(i,j)$ of each mesh(i,j) in Examples 8 to 10 is compensated, patterns A, B and C whose cross-sectional views are schematically shown in FIG. 16A sometimes cause a case where adjacent patterns for which some pattern area increase amount ΔS is taken into consideration overlap each other. That is, in some pattern, the boundary line which defines the circumferential length L of the projected portion of the second layer (layer) deposited on the pattern comes inside the projected portion of the second layer (layer) deposited on an adjacent pattern. In other words, the projected portion of the second layer (layer) deposited on one pattern overlaps a projected portion of the second layer (layer) deposited on an adjacent pattern. This state is shown in FIG. 16B. In FIG. 16B, the projected portions of the second layer (layers) deposited on the patterns A and C are indicated by "a" and "c", and these projected portions "a" and "c" of the second layer are shown by solid lines. On the other hand, a projected portion of the second layer (layer) deposited on the pattern B adjacent to the patterns A and C is indicated by "b", and the projected portion "b" of the second layer is shown by dotted lines. In the above case, a plurality of overlapping adjacent patterns can be considered to be one pattern ABC as shown in FIG. 16C. As explained in Example 10, when the second layer has a two-layer structure, the values of the first term and the second term of the right side member of the equation (6) will be negative and positive. And, when the lower layer of the second layer is deposited, there are some cases where a projected portion of the lower layer of the second layer (layer) deposited on some pattern overlaps a projected portion of the lower layer of the second layer (layer) deposited on an adjacent pattern. In the above case, therefore, it is necessary to individually consider the value of I based on the lower layer of the second layer and the value of I based on the upper layer of the second layer (layer) without merely applying the equation (6). That is, it is required to consider the pattern area increase amount ΔS based on the lower layer of the second layer (layer) and the pattern area increase amount ΔS based on the lower layer and the upper layer of the second layer (layer). In Examples 8 to 10, the first layer deposited on a substrate and the second layer deposited thereon are mainly taken up for explanations, while the embodiments in these Examples can be naturally applied to a substrate and a layer deposited thereon.

The present invention is explained on the basis of Examples hereinabove, while the present invention shall not be limited thereto. Those values, conditions, etc., explained in Examples and various materials used in Examples are shown as examples, and can be altered as required.

In the present invention, the pattern area ratio of the pattern formed in the first layer or the substrate can be made uniform. As a result, the flattening treatment of the second layer, the layer or the starting substrate can be uniformly and reliably carried out, and the CMP process does not require any additional steps. Further, after the CPM process is carried out, the variation in the height of the second layer or the layer or the variation of the remaining thickness of the starting substrate decreases, so that the process margin in the manufacture of an integrated circuit can be expanded. Even if the cross-sectional form of the projected portion of the second layer (layer) deposited on the pattern formed in the first layer (substrate) changes depending upon the method of depositing the second layer (layer), the pattern area ratio $\alpha_0(i,j)$ of each mesh(i,j) can be compensated according thereto, and the pattern area ratios $\alpha_0(i,j)$ closer to a practical achievement can be obtained, so that a mask pattern of a mask suitable for the production process of intended integrated circuits can be designed.

What is claimed is:

1. A method of designing a mask pattern to be formed in a mask used for manufacturing an integrated circuit by forming a pattern in a first layer deposited on a substrate, on the basis of lithography to which said mask is applied, then depositing a second layer on the substrate including the patterned first layer and flattening the second layer by a chemical/mechanical polishing process, the method comprising the steps of
(A) dividing the mask pattern into meshes having the form of a lattice and having a predetermined size, and determining pattern area ratios $\alpha_0(i,j)$ of the meshes(i,j), respectively,
(B) determining an average pattern area ratio $\beta(i,j)$ within a predetermined region including a mesh(i,j) as the central point in the predetermined region with regard to each of all the meshes in the mask pattern, and
(C) providing a dummy pattern to each of the meshes (i,j) which have been found in the step (B) to have the average pattern area ratios $\beta(i,j)$ smaller than a predetermined value.

2. The method according to claim 1, wherein the average pattern area ratio $\beta(i,j)$ is determined on the basis of the following equations (1-1) and (1-2).

$$\alpha_{q+1}(i,j) = \sum_{l=-m}^{l=m} \sum_{k=-m}^{k=m} \alpha_q(i+l, j+k)/(2m+1)^2 \quad (1\text{-}1)$$

$$\beta(i,j) = \alpha_{Q+1}(i,j) \quad (1\text{-}2)$$

wherein q=0, 1, 2, ..., Q.

3. The method according to claim 1, wherein a value of a pattern area ratio $\alpha_U(i,j)$ or a value of an average pattern area ratio $\beta_U(i,j)$ of a mask pattern in a mask used for forming a pattern in an underlayer provided under the first layer is incorporated for determining the pattern area ratio $\alpha_0(i,j)$ of each mesh(i,j).

4. The method according to claim 3, wherein the pattern area ratio $\alpha_0(i,j)$ of each mesh(i,j) is determined on the basis of the following equation (2) when the underlayer is not chemical/mechanical-polished, and the pattern area ratio $\alpha_0(i,j)$ of each mesh(i,j) is determined on the basis of the following equation (3) when the underlayer is chemical/mechanical-polished, $$\alpha_0(i,j)=\alpha_S(i,j)+(h_U/h_S)\cdot\alpha_U(i,j) \quad (2)$$

$$\alpha_0(i,j)=\alpha_S(i,j)+(h_U/h_S)\cdot\beta_U(i,j) \quad (3)$$

wherein $\alpha_S(i,j)$ is a pattern area ratio of the mesh(i,j) when it is assumed that no underlayer exists under the first layer, $h_S$ is a difference in level arising in the first layer after the formation of the pattern and $h_U$ is a difference in level arising in the underlayer.

5. The method according to claim 1, wherein the pattern area ratio $\alpha_0(i,j)$ of each mesh(i,j) is compensated on the basis of a pattern area increase ratio I determined by the thickness of the second layer to be deposited on the substrate including the patterned first layer or on the basis of a pattern area increase ratio I determined by the thickness of the pattern to be formed in the first layer and the thickness of the second layer to be deposited on the substrate including the patterned first layer.

6. The method according to claim 5, wherein the pattern area ratio $\alpha_0(i,j)$ of each mesh(i,j) is compensated on the basis of a pattern area increase amount $\Delta S$, $\Delta S$ being a pattern area increase amount determined by the thickness of the second layer to be deposited on the substrate including the patterned first layer or a pattern area increase amount determined by the thickness of the pattern to be formed in the first layer and the thickness of the second layer to be deposited on the substrate including the patterned first layer, $\Delta S$ being determined by multiplying I by L, L being a circumferential length of a portion of the second layer having a projected shape and being to be deposited on the pattern to be formed in the first layer.

7. The method according to claim 6, wherein, when the portion of the second layer having a projected shape and being to be deposited on the pattern to be formed in the first layer has a vertical side wall, the pattern area increase ratio I is determined on the basis of the following equation (4), $$I=X_0\times(r_H/r_V) \quad (4)$$

wherein $X_0$ is a thickness of the second layer to be deposited, $r_H$ is a deposition rate of the second layer in a horizontal direction and $r_V$ is a deposition rate of the second layer in a vertical direction.

8. The method according to claim 6, wherein, when the portion of the second layer having a projected shape and being to be deposited on the pattern to be formed in the first layer has an inclined side wall having an inclination angle of $\theta$ from a horizontal direction, the pattern area increase ratio I is determined on the basis of the following equation (5), $$I=(h_0-2X_0)\cot\theta/2 \quad (5)$$

wherein $h_0$ is a thickness of the pattern to be formed in the first layer and $X_0$ is a thickness of the second layer to be deposited.

9. The method according to claim 6, wherein, when the second layer has a lower layer and an upper layer and a portion of the lower layer having a projected shape and being to be deposited on the pattern to be formed in the first layer has an inclined side wall having an inclination angle of $\theta$ from a horizontal direction and a portion of the upper layer to be deposited on the inclined side wall of the lower layer has an inclined surface having an inclination angle of θ from a horizontal direction, the pattern area increase ratio I is determined on the basis of the following equation (6), $$I=(h_0-2Y_1)\cot\theta/2+Y_2(r_{2H}/r_{2V}-\cos\theta)/\sin\theta \quad (6)$$

wherein $h_0$ is a thickness of the pattern to be formed in the first layer, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

10. A method of designing a mask pattern to be formed in a mask used for manufacturing an integrated circuit by forming a pattern in a substrate, on the basis of lithography to which said mask is applied, then depositing a layer on the substrate and flattening the layer by a chemical/mechanical polishing process, the method comprising the steps of
- (A) dividing the mask pattern into meshes having the form of a lattice and having a predetermined size, and determining pattern area ratios $\alpha_0(i,j)$ of the meshes(i,j), respectively,
- (B) determining an average pattern area ratio $\beta(i,j)$ within a predetermined region including a mesh(i,j) as the central point in the predetermined region with regard to each of all the meshes in the mask pattern, and
- (C) providing a dummy pattern to each of the meshes (i,j) which have been found in the step (B) to have the average pattern area ratios $\beta(i,j)$ smaller than a predetermined value.

11. The method according to claim 10, wherein the average pattern area ratio $\beta(i,j)$ is determined on the basis of the following equations (1-1) and (1-2), $$\alpha_{q+1}(i,j)=\sum_{l=-m}^{l=m}\sum_{k=-m}^{k=m}\alpha_q(i+l,j+k)/(2m+1)^2 \quad (1\text{-}1)$$

$$\beta(i,j)=\alpha_{Q+1}(i,j) \quad (1\text{-}2)$$

wherein q=0, 1, 2, . . . , Q.

12. The method according to claim 10, wherein the pattern area ratio $\alpha_0(i,j)$ of each mesh(i,j) is compensated on the basis of a pattern area increase ratio I determined by the thickness of the layer to be deposited on the substrate or on the basis of a pattern area increase ratio I determined by the thickness of the pattern to be formed in the substrate and the thickness of the layer to be deposited on the substrate.

13. The method according to claim 12, wherein the pattern area ratio $\alpha_0(i,j)$ of each mesh(i,j) is compensated on the basis of a pattern area increase amount ΔS, ΔS being a pattern area increase amount determined by the thickness of the layer to be deposited on the substrate or a pattern area increase amount determined by the thickness of the pattern to be formed in the substrate and the thickness of the layer to be deposited on the substrate, ΔS being determined by multiplying I by L, L being a circumferential length of a portion of the layer having a projected shape and being to be deposited on the pattern to be formed in the substrate.

14. The method according to claim 13, wherein, when the portion of the layer having a projected shape and being to be deposited on the pattern to be formed in the substrate has a vertical side wall, the pattern area increase ratio I is determined on the basis of the following equation (4), $$I=X_0\times(r_H/r_V) \quad (4)$$

wherein $X_0$ is a thickness of the layer to be deposited, $r_H$ is a deposition rate of the layer in a horizontal direction and $r_V$ is a deposition rate of the layer in a vertical direction.

15. The method according to claim 13, wherein, when the portion of the layer having a projected shape and being to be deposited on the pattern to be formed in the substrate has an inclined side wall having an inclination angle of θ from a horizontal direction, the pattern area increase ratio I is determined on the basis of the following equation (5), $$I=(h_0-2X_0)\cot\theta/2 \quad (5)$$

wherein $h_0$ is a thickness of the pattern to be formed in the substrate and $X_0$ is a thickness of the layer to be deposited.

16. The method according to claim 13, wherein, when the layer has a lower layer and an upper layer and a portion of the lower layer having a projected shape and being to be deposited on the pattern to be formed in the substrate has an inclined side wall having an inclination angle of θ from a horizontal direction and a portion of the upper layer to be deposited on the inclined side wall of the lower layer has an inclined surface having an inclination angle of θ from a horizontal direction, the pattern area increase ratio I is determined on the basis of the following equation (6), $$I=(h_0-2Y_1)\cot\theta/2+Y_2(r_{2H}/r_{2V}-\cos\theta)/\sin\theta \quad (6)$$

wherein $h_0$ is a thickness of the pattern to be formed in the substrate, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

17. A method of designing a mask pattern to be formed in a mask used for manufacturing an integrated circuit by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process, the method comprising the steps of
- (A) dividing the mask pattern into meshes having the form of a lattice and having a predetermined size, and determining pattern area ratios $\alpha_0(i,j)$ of the meshes(i,j), respectively,
- (B) determining an average pattern area ratio $\beta(i,j)$ within a predetermined region including a mesh(i,j) as the central point in the predetermined region with regard to each of all the meshes in the mask pattern, and
- (C) providing a dummy pattern to each of the meshes (i,j) which have been found in the step (B) to have the average pattern area ratios $\beta(i,j)$ smaller than a predetermined value.

18. The method according to claim 17, wherein the average pattern area ratio $\beta(i,j)$ is determined on the basis of the following equations (1-1) and (1-2), $$\alpha_{q+1}(i,j)=\sum_{l=-m}^{l=m}\sum_{k=-m}^{k=m}\alpha_q(i+l,j+k)/(2m+1)^2 \quad (1\text{-}1)$$

$$\beta(i,j)=\alpha_{Q+1}(i,j) \quad (1\text{-}2)$$

wherein q=0, 1, 2, . . . , Q.

19. A method of designing a mask pattern to be formed in a mask used for manufacturing an integrated circuit by forming a pattern in a first layer deposited on a substrate, on the basis of lithography to which said mask is applied, then depositing a second layer on the substrate including the patterned first layer and flattening the second layer by a chemical/mechanical polishing process, the method comprising the steps of
(A) dividing the mask pattern into meshes having the form of a lattice and having a predetermined size, and determining pattern area ratios $\alpha_0(i,j)$ of the meshes$(i,j)$, respectively,
(B) determining an average pattern area ratio $\beta(i,j)$ within a predetermined region including a mesh$(i,j)$ as the central point in the predetermined region with regard to each of all the meshes in the mask pattern, and
(C) rearranging the pattern in the mask pattern so as to decrease the fluctuation of the average pattern area ratios $\beta(i,j)$.

20. The method according to claim 19, wherein the average pattern area ratio $\beta(i,j)$ is determined on the basis of the following equations (1-1) and (1-2), $$\alpha_{q+1}(i, j) = \sum_{l=-m}^{l=m} \sum_{k=-m}^{k=m} \alpha_q(i+l, j+k)/(2m+1)^2 \quad (1\text{-}1)$$

$$\beta(i, j) = \alpha_{Q+1}(i, j) \quad (1\text{-}2)$$

wherein q=0, 1, 2, ..., Q.

21. The method according to claim 19, wherein the pattern in the mask pattern belongs to any of a plurality of circuit block, and the rearrangement of the pattern in the step (C) includes an increase of the size of the circuit block.

22. The method according to claim 19, wherein the pattern area ratio $\alpha_0(i,j)$ of each mesh$(i,j)$ is compensated on the basis of a pattern area increase ratio I determined by the thickness of the second layer to be deposited on the substrate including the patterned first layer or on the basis of a pattern area increase ratio I determined by the thickness of the pattern to be formed in the first layer and the thickness of the second layer to be deposited on the substrate including the patterned first layer.

23. The method according to claim 22, wherein the pattern area ratio $\alpha_0(i,j)$ of each mesh$(i,j)$ is compensated on the basis of a pattern area increase amount $\Delta S$, $\Delta S$ being a pattern area increase amount determined by the thickness of the second layer to be deposited on the substrate including the patterned first layer or a pattern area increase amount determined by the thickness of the pattern to be formed in the first layer and the thickness of the second layer to be deposited on the substrate including the patterned first layer, $\Delta S$ being determined by multiplying I by L, L being a circumferential length of a portion of the second layer having a projected shape and being to be deposited on the pattern to be formed in the first layer.

24. The method according to claim 23, wherein, when the portion of the second layer having a projected shape and being to be deposited on the pattern to be formed in the first layer has a vertical side wall, the pattern area increase ratio I is determined on the basis of the following equation (4), $$I = X_0 \times (r_H/r_V) \quad (4)$$

wherein $X_0$ is a thickness of the second layer to be deposited, $r_H$ is a deposition rate of the second layer in a horizontal direction and $r_V$ is a deposition rate of the second layer in a vertical direction.

25. The method according to claim 23, wherein, when the portion of the second layer having a projected shape and being to be deposited on the pattern to be formed in the first layer has an inclined side wall having an inclination angle of $\theta$ from a horizontal direction, the pattern area increase ratio I is determined on the basis of the following equation (5), $$I = (h_0 - 2X_0) \cot \theta/2 \quad (5)$$

wherein $h_0$ is a thickness of the pattern to be formed in the first layer and $X_0$ is a thickness of the second layer to be deposited.

26. The method according to claim 23, wherein, when the second layer has a lower layer and an upper layer and a portion of the lower layer having a projected shape and being to be deposited on the pattern to be formed in the first layer has an inclined side wall having an inclination angle of $\theta$ from a horizontal direction and a portion of the upper layer to be deposited on the inclined side wall of the lower layer has an inclined surface having an inclination angle of $\theta$ from a horizontal direction, the pattern area increase ratio I is determined on the basis of the following equation (6), $$I = (h_0 - 2Y_1) \cot \theta/2 + Y_2(r_{2H}/r_{2V} - \cos \theta)/\sin \theta \quad (6)$$

wherein $h_0$ is a thickness of the pattern to be formed in the first layer, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

27. A method of designing a mask pattern to be formed in a mask used for manufacturing an integrated circuit by forming a pattern in a substrate, on the basis of lithography to which said mask is applied, then depositing a layer on the substrate and flattening the layer by a chemical/mechanical polishing process, the method comprising the steps of
(A) dividing the mask pattern into meshes having the form of a lattice and having a predetermined size, and determining pattern area ratios $\alpha_0(i,j)$ of the meshes$(i,j)$, respectively,
(B) determining an average pattern area ratio $\beta(i,j)$ within a predetermined region including a mesh$(i,j)$ as the central point in the predetermined region with regard to each of all the meshes in the mask pattern, and
(C) rearranging the pattern in the mask pattern so as to decrease the fluctuation of the average pattern area ratios $\beta(i,j)$.

28. The method according to claim 27, wherein the average pattern area ratio $\beta(i,j)$ is determined on the basis of the following equations (1-1) and (1-2), $$\alpha_{q+1}(i, j) = \sum_{l=-m}^{l=m} \sum_{k=-m}^{k=m} \alpha_q(i+l, j+k)/(2m+1)^2 \quad (1\text{-}1)$$

$$\beta(i, j) = \alpha_{Q+1}(i, j) \quad (1\text{-}2)$$

wherein q=0, 1, 2, ..., Q.

29. The method according to claim 27, wherein the pattern in the mask pattern belongs to any of a plurality of circuit block, and the rearrangement of the pattern in the step (C) includes an increase of the size of the circuit block.

30. The method according to claim 27, wherein the pattern area ratio $\alpha_0(i,j)$ of each mesh$(i,j)$ is compensated on the basis of a pattern area increase ratio I determined by the thickness of the layer to be deposited on the substrate or on the basis of a pattern area increase ratio I determined by the thickness of the pattern to be formed in the substrate and the thickness of the layer to be deposited on the substrate.

31. The method according to claim 30, wherein the pattern area ratio $\alpha_0(i,j)$ of each mesh(i,j) is compensated on the basis of a pattern area increase amount $\Delta S$, $\Delta S$ being a pattern area increase amount determined by the thickness of the layer to be deposited on the substrate or a pattern area increase amount determined by the thickness of the pattern to be formed in the substrate and the thickness of the layer to be deposited on the substrate, $\Delta S$ being determined by multiplying I by L, L being a circumferential length of a portion of the layer having a projected shape and being to be deposited on the pattern to be formed in the substrate.

32. The method according to claim 31, wherein, when the portion of the layer having a projected shape and being to be deposited on the pattern to be formed in the substrate has a vertical side wall, the pattern area increase ratio I is determined on the basis of the following equation (4), $$I = X_0 \times (r_H/r_V) \tag{4}$$

wherein $X_0$ is a thickness of the layer to be deposited, $r_H$ is a deposition rate of the layer in a horizontal direction and $r_V$ is a deposition rate of the layer in a vertical direction.

33. The method according to claim 31, wherein, when the portion of the layer having a projected shape and being to be deposited on the pattern to be formed in the substrate has an inclined side wall having an inclination angle of θ from a horizontal direction, the pattern area increase ratio I is determined on the basis of the following equation (5), $$I = (h_0 - 2X_0) \cot \theta/2 \tag{5}$$

wherein $h_0$ is a thickness of the pattern to be formed in the substrate and $X_0$ is a thickness of the layer to be deposited.

34. The method according to claim 31, wherein, when the layer has a lower layer and an upper layer and a portion of the lower layer having a projected shape and being to be deposited on the pattern to be formed in the substrate has an inclined side wall having an inclination angle of θ from a horizontal direction and a portion of the upper layer to be deposited on the inclined side wall of the lower layer has an inclined surface having an inclination angle of θ from a horizontal direction, the pattern area increase ratio I is determined on the basis of the following equation (6), $$I = (h_0 - 2Y_1) \cot \theta/2 + Y_2(r_{2H}/r_{2V} - \cos \theta)/\sin \theta \tag{6}$$

wherein $h_0$ is a thickness of the pattern to be formed in the substrate, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

35. A method of designing a mask pattern to be formed in a mask used for manufacturing an integrated circuit by forming a pattern in a starting substrate, on the basis of lithography to which said mask is applied, then bonding the front surface of the starting substrate to a supporting substrate and flattening the starting substrate from the back surface of the starting substrate by a chemical/mechanical polishing process, the method comprising the steps of
(A) dividing the mask pattern into meshes having the form of a lattice and having a predetermined size, and determining pattern area ratios $\alpha_0(i,j)$ of the meshes(i,j), respectively, (B) determining an average pattern area ratio $\beta(i,j)$ within a predetermined region including a mesh(i,j) as the central point in the predetermined region with regard to each of all the meshes in the mask pattern, and
(C) rearranging the pattern in the mask pattern so as to decrease the fluctuation of the average pattern area ratios $\beta(i,j)$.

36. The method according to claim 35, wherein the average pattern area ratio $\beta(i,j)$ is determined on the basis of the following equations (1-1) and (1-2), $$\alpha_{q+1}(i,j) = \sum_{l=-m}^{l=m} \sum_{k=-m}^{k=m} \alpha_q(i+l, j+k)/(2m+1)^2 \tag{1-1}$$

$$\beta(i,j) = \alpha_{Q+1}(i,j) \tag{1-2}$$

wherein q=0, 1, 2, . . . , Q.

37. The method according to claim 35, wherein the pattern in the mask pattern belongs to any of a plurality of circuit block, and the rearrangement of the pattern in the step (C) includes an increase of the size of the circuit block.

38. A method of manufacturing an integrated circuit by forming a pattern in a first layer deposited on a substrate, then depositing a second layer on the substrate including the patterned first layer and flattening the second layer by a chemical/mechanical polishing process, wherein a mask pattern to be formed in a mask is designed by the steps of
(A) dividing the mask pattern into meshes having the form of a lattice and having a predetermined size, and determining pattern area ratios $\alpha_0(i,j)$ of the meshes(i,j), respectively,
(B) determining an average pattern area ratio $\beta(i,j)$ within a predetermined region including a mesh(i,j) as the central point in the predetermined region with regard to each of all the meshes in the mask pattern, and
(C) providing a dummy pattern to each of the meshes (i,j) which have been found in the step (B) to have the average pattern area ratios $\beta(i,j)$ smaller than a predetermined value, and
the pattern is formed in the first layer on the basis of lithography to which said mask is applied.

39. The method according to claim 38, wherein the average pattern area ratio $\beta(i,j)$ is determined on the basis of the following equations (1-1) and (1-2), $$\alpha_{q+1}(i,j) = \sum_{l=-m}^{l=m} \sum_{k=-m}^{k=m} \alpha_q(i+l, j+k)/(2m+1)^2 \tag{1-1}$$

$$\beta(i,j) = \alpha_{Q+1}(i,j) \tag{1-2}$$

wherein q=0, 1, 2, . . . , Q.

40. The method according to claim 38, wherein a value of a pattern area ratio $\alpha_U(i,j)$ or a value of an average pattern area ratio $\beta_U(i,j)$ of a mask pattern in a mask used for forming a pattern in an underlayer provided under the first layer is incorporated for determining the pattern area ratio $\alpha_0(i,j)$ of each mesh(i,j).

41. The method according to claim 40, wherein the pattern area ratio $\alpha_0(i,j)$ of each mesh(i,j) is determined on the basis of the following equation (2) when the underlayer is not chemical/mechanical-polished, and the pattern area ratio $\alpha_0(i,j)$ of each mesh(i,j) is determined on the basis of the following equation (3) when the underlayer is chemical/mechanical-polished, $$\alpha_0(i,j)=\alpha_S(i,j)+(h_U/h_S)\cdot\alpha_U(i,j) \quad (2)$$

$$\alpha_0(i,j)=\alpha_S(i,j)+(h_U/h_S)\cdot\beta_U(i,j) \quad (3)$$

wherein $\alpha_0(i,j)$ is a pattern area ratio of the mesh(i,j) when it is assumed that no underlayer exists under the first layer, $h_S$ is a difference in level arising in the first layer after the formation of the pattern and $h_U$ is a difference in level arising in the underlayer.

42. The method according to claim 38, wherein the pattern area ratio $\alpha_0(i,j)$ of each mesh(i,j) is compensated on the basis of a pattern area increase ratio I determined by the thickness of the second layer to be deposited on the substrate including the patterned first layer or on the basis of a pattern area increase ratio I determined by the thickness of the pattern to be formed in the first layer and the thickness of the second layer to be deposited on the substrate including the patterned first layer.

43. The method according to claim 42, wherein the pattern area ratio $\alpha_0(i,j)$ of each mesh(i,j) is compensated on the basis of a pattern area increase amount $\Delta S$, $\Delta S$ being a pattern area increase amount determined by the thickness of the second layer to be deposited on the substrate including the patterned first layer or a pattern area increase amount determined by the thickness of the pattern to be formed in the first layer and the thickness of the second layer to be deposited on the substrate including the patterned first layer, $\Delta S$ being determined by multiplying I by L, L being a circumferential length of a portion of the second layer having a projected shape and being to be deposited on the pattern to be formed in the first layer.

44. The method according to claim 43, wherein, when the portion of the second layer having a projected shape and being to be deposited on the pattern to be formed in the first layer has a vertical side wall, the pattern area increase ratio I is determined on the basis of the following equation (4), $$I=X_0\times(r_H/r_V) \quad (4)$$

wherein $X_0$ is a thickness of the second layer to be deposited, $r_H$ is a deposition rate of the second layer in a horizontal direction and $r_V$ is a deposition rate of the second layer in a vertical direction.

45. The method according to claim 43, wherein, when the portion of the second layer having a projected shape and being to be deposited on the pattern to be formed in the first layer has an inclined side wall having an inclination angle of $\theta$ from a horizontal direction, the pattern area increase ratio I is determined on the basis of the following equation (5), $$I=(h_0-2X_0)\cot\theta/2 \quad (5)$$

wherein $h_0$ is a thickness of the pattern to be formed in the first layer and $X_0$ is a thickness of the second layer to be deposited.

46. The method according to claim 43, wherein, when the second layer has a lower layer and an upper layer and a portion of the lower layer having a projected shape and being to be deposited on the pattern to be formed in the first layer has an inclined side wall having an inclination angle of $\theta$ from a horizontal direction and a portion of the upper layer to be deposited on the inclined side wall of the lower layer has an inclined surface having an inclination angle of $\theta$ from a horizontal direction, the pattern area increase ratio I is determined on the basis of the following equation (6), $$I=(h_0-2Y_1)\cot\theta/2+y_2(r_{2H}/r_V-\cos\theta)/\sin\theta \quad (6)$$

wherein $h_0$ is a thickness of the pattern to be formed in the first layer, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

47. A method of manufacturing an integrated circuit by forming a pattern in a substrate, then depositing a layer on the substrate and flattening the layer by a chemical/mechanical polishing process, wherein a mask pattern to be formed in a mask is designed by the steps of
(A) dividing the mask pattern into meshes having the form of a lattice and having a predetermined size, and determining pattern area ratios $\alpha_0(i,j)$ of the meshes(i,j), respectively,
(B) determining an average pattern area ratio $\beta(i,j)$ within a predetermined region including a mesh(i,j) as the central point in the predetermined region with regard to each of all the meshes in the mask pattern, and
(C) providing a dummy pattern to each of the meshes (i,j) which have been found in the step (B) to have the average pattern area ratios $\beta(i,j)$ smaller than a predetermined value, and the pattern is formed in the substrate on the basis of lithography to which said mask is applied.

48. The method according to claim 47, wherein the average pattern area ratio $\beta(i,j)$ is determined on the basis of the following equations (1-1) and (1-2), $$\alpha_{q+1}(i,j) = \sum_{l=-m}^{l=m}\sum_{k=-m}^{k=m}\alpha_q(i+l,j+k)/(2m+1)^2 \quad (1\text{-}1)$$

$$\beta(i,j) = \alpha_{Q+1}(i,j) \quad (1\text{-}2)$$

wherein q=0, 1, 2, . . . , Q.

49. The method according to claim 47, wherein the pattern area ratio $\alpha_0(i,j)$ of each mesh(i,j) is compensated on the basis of a pattern area increase ratio I determined by the thickness of the layer to be deposited on the substrate or on the basis of a pattern area increase ratio I determined by the thickness of the pattern to be formed in the substrate and the thickness of the layer to be deposited on the substrate.

50. The method according to claim 49, wherein the pattern area ratio $\alpha_0(i,j)$ of each mesh(i,j) is compensated on the basis of a pattern area increase amount $\Delta S$, $\Delta S$ being a pattern area increase amount determined by the thickness of the layer to be deposited on the substrate or a pattern area increase amount determined by the thickness of the pattern to be formed in the substrate and the thickness of the layer to be deposited on the substrate, $\Delta S$ being determined by multiplying I by L, L being a circumferential length of a portion of the layer having a projected shape and being to be deposited on the pattern to be formed in the substrate.

51. The method according to claim 50, wherein, when the portion of the layer having a projected shape and being to be deposited on the pattern to be formed in the substrate has a vertical side wall, the pattern area increase ratio I is determined on the basis of the following equation (4), $$I=X_0\times(r_H/r_V) \quad (4)$$

wherein $X_0$ is a thickness of the layer to be deposited, $r_H$ is a deposition rate of the layer in a horizontal direction and $r_V$ is a deposition rate of the layer in a vertical direction.

52. The method according to claim 50, wherein, when the portion of the layer having a projected shape and being to be deposited on the pattern to be formed in the substrate has an inclined side wall having an inclination angle of $\theta$ from a horizontal direction, the pattern area increase ratio I is determined on the basis of the following equation (5), $$I=(h_0-2X_0)\cot\theta/2 \tag{5}$$

wherein $h_0$ is a thickness of the pattern to be formed in the substrate and $X_0$ is a thickness of the layer to be deposited.

53. The method according to claim 50, wherein, when the layer has a lower layer and an upper layer and a portion of the lower layer having a projected shape and being to be deposited on the pattern to be formed in the substrate has an inclined side wall having an inclination angle of $\theta$ from a horizontal direction and a portion of the upper layer to be deposited on the inclined side wall of the lower layer has an inclined surface having an inclination angle of $\theta$ from a horizontal direction, the pattern area increase ratio I is determined on the basis of the following equation (6), $$I=(h_0-2Y_1)\cot\theta/2+Y_2(r_{2H}/r_{2V}-\cos\theta)/\sin\theta \tag{6}$$

wherein $h_0$ is a thickness of the pattern to be formed in the substrate, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

54. A method of manufacturing an integrated circuit by forming a pattern in a starting substrate, then bonding the front surface of the starting substrate to a supporting substrate and flattening the starting substrate from the back surface of the starting substrate by a chemical/mechanical polishing process, wherein a mask pattern to be formed in a mask is designed by the steps of
  (A) dividing the mask pattern into meshes having the form of a lattice and having a predetermined size, and determining pattern area ratios $\alpha_0(i,j)$ of the meshes(i,j), respectively,
  (B) determining an average pattern area ratio $\beta(i,j)$ within a predetermined region including a mesh(i,j) as the central point in the predetermined region with regard to each of all the meshes in the mask pattern, and
  (C) providing a dummy pattern to each of the meshes (i,j) which have been found in the step (B) to have the average pattern area ratios $\beta(i,j)$ smaller than a predetermined value, and
the pattern is formed in the starting substrate on the basis of lithography to which said mask is applied.

55. The method according to claim 54, wherein the average pattern area ratio $\beta(i,j)$ is determined on the basis of the following equations (1-1) and (1-2), $$\alpha_{q+1}(i,j) = \sum_{l=-m}^{l=m}\sum_{k=-m}^{k=m} \alpha_q(i+l, j+k)/(2m+1)^2 \tag{1-1}$$

$$\beta(i,j) = \alpha_{Q+1}(i,j) \tag{1-2}$$

wherein q=0, 1, 2, ..., Q.

56. A method of manufacturing an integrated circuit by forming a pattern in a first layer deposited on a substrate, then depositing a second layer on the substrate including the patterned first layer and flattening the second layer by a chemical/mechanical polishing process, wherein a mask pattern to be formed in a mask is designed by the steps of
  (A) dividing the mask pattern into meshes having the form of a lattice and having a predetermined size, and determining pattern area ratios $\alpha_0(i,j)$ of the meshes(i,j), respectively,
  (B) determining an average pattern area ratio $\beta(i,j)$ within a predetermined region including a mesh(i,j) as the central point in the predetermined region with regard to each of all the meshes in the mask pattern, and
  (C) rearranging the pattern in the mask pattern so as to decrease the fluctuation of the average pattern area ratios $\beta(i,j)$, and
the pattern is formed in the first layer on the basis of lithography to which said mask is applied.

57. The method according to claim 56, wherein the average pattern area ratio $\beta(i,j)$ is determined on the basis of the following equations (1-1) and (1-2), $$\alpha_{q+1}(i,j) = \sum_{l=-m}^{l=m}\sum_{k=-m}^{k=m} \alpha_q(i+l, j+k)/(2m+1)^2 \tag{1-1}$$

$$\beta(i,j) = \alpha_{Q+1}(i,j) \tag{1-2}$$

wherein q=0, 1, 2, ..., Q.

58. The method according to claim 56, wherein the pattern in the mask pattern belongs to any of a plurality of circuit block, and the rearrangement of the pattern in the step (C) includes an increase of the size of the circuit block.

59. The method according to claim 56, wherein the pattern area ratio $\alpha_0(i,j)$ of each mesh(i,j) is compensated on the basis of a pattern area increase ratio I determined by the thickness of the second layer to be deposited on the substrate including the patterned first layer or on the basis of a pattern area increase ratio I determined by the thickness of the pattern to be formed in the first layer and the thickness of the second layer to be deposited on the substrate including the patterned first layer.

60. The method according to claim 59, wherein the pattern area ratio $\alpha_0(i,j)$ of each mesh(i,j) is compensated on the basis of a pattern area increase amount $\Delta S$, $\Delta S$ being a pattern area increase amount determined by the thickness of the second layer to be deposited on the substrate including the patterned first layer or a pattern area increase amount determined by the thickness of the pattern to be formed in the first layer and the thickness of the second layer to be deposited on the substrate including the patterned first layer, $\Delta S$ being determined by multiplying I by L, L being a circumferential length of a portion of the second layer having a projected shape and being to be deposited on the pattern to be formed in the first layer.

61. The method according to claim 60, wherein, when the portion of the second layer having a projected shape and being to be deposited on the pattern to be formed in the first layer has a vertical side wall, the pattern area increase ratio I is determined on the basis of the following equation (4), $$I=X_0\times(r_H/r_V) \tag{4}$$

wherein $X_0$ is a thickness of the second layer to be deposited, $r_H$ is a deposition rate of the second layer in a horizontal direction and $r_V$ is a deposition rate of the second layer in a vertical direction.

62. The method according to claim 60, wherein, when the portion of the second layer having a projected shape and being to be deposited on the pattern to be formed in the first layer has an inclined side wall having an inclination angle of θ from a horizontal direction, the pattern area increase ratio I is determined on the basis of the following equation (5), $$I=(h_0-2X_0) \cot \theta/2 \qquad (5)$$

wherein $h_0$ is a thickness of the pattern to be formed in the first layer and $X_0$ is a thickness of the second layer to be deposited.

63. The method according to claim 60, wherein, when the second layer has a lower layer and an upper layer and a portion of the lower layer having a projected shape and being to be deposited on the pattern to be formed in the first layer has an inclined side wall having an inclination angle of θ from a horizontal direction and a portion of the upper layer to be deposited on the inclined side wall of the lower layer has an inclined surface having an inclination angle of θ from a horizontal direction, the pattern area increase ratio I is determined on the basis of the following equation (6), $$I=(h_0-2Y_1) \cot \theta/2+Y_2(r_{2H}/r_{2V}-\cos \theta)/\sin \theta \qquad (6)$$

wherein $h_0$ is a thickness of the pattern to be formed in the first layer, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

64. A method of manufacturing an integrated circuit by forming a pattern in a substrate, then depositing a layer on the substrate and flattening the layer by a chemical/mechanical polishing process,
wherein a mask pattern to be formed in a mask is designed by the steps of
(A) dividing the mask pattern into meshes having the form of a lattice and having a predetermined size, and determining pattern area ratios $\alpha_0(i,j)$ of the meshes(i,j), respectively,
(B) determining an average pattern area ratio $\beta(i,j)$ within a predetermined region including a mesh(i,j) as the central point in the predetermined region with regard to each of all the meshes in the mask pattern, and
(C) rearranging the pattern in the mask pattern so as to decrease the fluctuation of the average pattern area ratios $\beta(i,j)$, and the pattern is formed in the substrate on the basis of lithography to which said mask is applied.

65. The method according to claim 64, wherein the average pattern area ratio $\beta(i,j)$ is determined on the basis of the following equations (1-1) and (1-2), $$\alpha_{q+1}(i, j) = \sum_{l=-m}^{l=m} \sum_{k=-m}^{k=m} \alpha_q(i+l, j+k)/(2m+1)^2 \qquad (1-1)$$

$$\beta(i, j) = \alpha_{Q+1}(i, j) \qquad (1-2)$$

wherein q=0, 1, 2, . . . , Q.

66. The method according to claim 64, wherein the pattern in the mask pattern belongs to any of a plurality of circuit block, and the rearrangement of the pattern in the step (C) includes an increase of the size of the circuit block.

67. The method according to claim 64, wherein the pattern area ratio $\alpha_0(i,j)$ of each mesh(i,j) is compensated on the basis of a pattern area increase ratio I determined by the thickness of the layer to be deposited on the substrate or on the basis of a pattern area increase ratio I determined by the thickness of the pattern to be formed in the substrate and the thickness of the layer to be deposited on the substrate.

68. The method according to claim 67, wherein the pattern area ratio $\alpha_0(i,j)$ of each mesh(i,j) is compensated on the basis of a pattern area increase amount ΔS, ΔS being a pattern area increase amount determined by the thickness of the layer to be deposited on the substrate or a pattern area increase amount determined by the thickness of the pattern to be formed in the substrate and the thickness of the layer to be deposited on the substrate, ΔS being determined by multiplying I by L, L being a circumferential length of a portion of the layer having a projected shape and being to be deposited on the pattern to be formed in the substrate.

69. The method according to claim 68, wherein, when the portion of the layer having a projected shape and being to be deposited on the pattern to be formed in the substrate has a vertical side wall, the pattern area increase ratio I is determined on the basis of the following equation (4), $$I=X_0 \times (r_H/r_V) \qquad (4)$$

wherein $X_0$ is a thickness of the layer to be deposited, $r_H$ is a deposition rate of the layer in a horizontal direction and $r_V$ is a deposition rate of the layer in a vertical direction.

70. The method according to claim 68, wherein, when the portion of the layer having a projected shape and being to be deposited on the pattern to be formed in the substrate has an inclined side wall having an inclination angle of θ from a horizontal direction, the pattern area increase ratio I is determined on the basis of the following equation (5), $$I=(h_0-2X_0) \cot \theta/2 \qquad (5)$$

wherein $h_0$ is a thickness of the pattern to be formed in the substrate, and $X_0$ is a thickness of the layer to be deposited.

71. The method according to claim 68, wherein, when the layer has a lower layer and an upper layer and a portion of the lower layer having a projected shape and being to be deposited on the pattern to be formed in the substrate has an inclined side wall having an inclination angle of θ from a horizontal direction and a portion of the upper layer to be deposited on the inclined side wall of the lower layer has an inclined surface having an inclination angle of θ from a horizontal direction, the pattern area increase ratio I is determined on the basis of the following equation (6), $$I=(h_0-2Y_1) \cot \theta/2+Y_2(r_{2H}/r_{2V}-\cos \theta)/\sin \theta \qquad (6)$$

wherein $h_0$ is a thickness of the pattern to be formed in the substrate, $Y_1$ is a thickness of the lower layer to be deposited, $Y_2$ is a thickness of the upper layer to be deposited, $r_{2H}$ is a deposition rate of the upper layer in a horizontal direction and $r_{2V}$ is a deposition rate of said portion of the upper layer in a normal direction.

72. A method of manufacturing an integrated circuit by forming a pattern in a starting substrate, then bonding the front surface of the starting substrate to a supporting substrate and flattening the starting substrate from the back surface of the starting substrate by a chemical/mechanical polishing process,
wherein a mask pattern to be formed in a mask is designed by the steps of
(A) dividing the mask pattern into meshes having the form of a lattice and having a predetermined size, and determining pattern area ratios $\alpha_0(i,j)$ of the meshes(i,j), respectively,
(B) determining an average pattern area ratio $\beta(i,j)$ within a predetermined region including a mesh(i,j)

as the central point in the predetermined region with regard to each of all the meshes in the mask pattern, and (C) rearranging the pattern in the mask pattern so as to decrease the fluctuation of the average pattern area ratios $\beta(i,j)$, and the pattern is formed in the starting substrate on the basis of lithography to which said mask is applied.

73. The method according to claim 72, wherein the average pattern area ratio $\beta(i,j)$ is determined on the basis of the following equations (1-1) and (1-2), $$\alpha_{q+1}(i,j) = \sum_{l=-m}^{l=m} \sum_{k=-m}^{k=m} \alpha_q(i+l, j+k)/(2m+1)^2 \qquad (1\text{-}1)$$

$$\beta(i,j) = \alpha_{Q+1}(i,j) \qquad (1\text{-}2)$$

wherein q=0, 1, 2, . . . , Q.

74. The method according to claim 72, wherein the pattern in the mask pattern belongs to any of a plurality of circuit block, and the rearrangement of the pattern in the step (C) includes an increase of the size of the circuit block.

* * * * *